US012756345B2

United States Patent
(12) United States Patent
Buehler et al.

(10) Patent No.: US 12,756,345 B2
(45) Date of Patent: Oct. 6, 2026

(54) SYSTEMS FOR POWER MODULE ASSEMBLY FOR INVERTER

(71) Applicant: BorgWarner US Technologies LLC, Wilmington, DE (US)

(72) Inventors: David Paul Buehler, Noblesville, IN (US); Kevin M. Gertiser, Carmel, IN (US); Junming Liang, Kokomo, IN (US)

(73) Assignee: BorgWarner US Technologies LLC, Wilmington, DE (US)

(*) Notice: Subject to any disclaimer, the term of this patent is extended or adjusted under 35 U.S.C. 154(b) by 238 days.

(21) Appl. No.: 18/618,644

(22) Filed: Mar. 27, 2024

(65) Prior Publication Data

US 2025/0286492 A1 Sep. 11, 2025

Related U.S. Application Data

(60) Provisional application No. 63/562,673, filed on Mar. 7, 2024.

(51) Int. Cl.

| | |
|---|---|
| ***H02P 27/06*** | (2006.01) |
| ***H02P 25/18*** | (2006.01) |
| ***H05K 7/20*** | (2006.01) |

(52) U.S. Cl.

CPC ............. *H02P 27/06* (2013.01); *H05K 7/209* (2013.01); *H02P 25/184* (2013.01)

(58) Field of Classification Search

CPC ............ H02P 1/32; H02P 27/06; H02P 25/18; H02M 7/493; H02M 7/5387; H02M 7/003; H05K 7/209

See application file for complete search history.

(56) References Cited

U.S. PATENT DOCUMENTS

| | | | | |
|---|---|---|---|---|
| 10,910,957 | B1 | 2/2021 | Shenoy et al. | |
| 2012/0007535 | A1* | 1/2012 | Jansson ................ | H02M 7/003 318/558 |
| 2019/0229670 | A1 | 7/2019 | Arisawa et al. | |
| 2019/0255960 | A1 | 8/2019 | Töns et al. | |
| 2020/0059189 | A1 | 2/2020 | Ohashi | |

(Continued)

FOREIGN PATENT DOCUMENTS

| | | |
|---|---|---|
| CN | 104167934 B | 2/2017 |
| CN | 111478645 A | 7/2020 |

(Continued)

*Primary Examiner* — Said Bouziane

(74) *Attorney, Agent, or Firm* — Joshua M. Haines; Bookoff McAndrews, PLLC

(57) ABSTRACT

Disclosed solutions relate to electrical inverters. In an example, an inverter to convert DC power from a voltage source to AC power to drive a motor is disclosed. The inverter includes a first power module. The first power module includes first phase switches, second phase switches and positive DC power tabs connected to a positive DC rail to provide positive DC power to the first phase switches and the second phase switches. The inverter further includes negative DC power tabs connected to a negative DC rail to provide negative DC power to the first phase switches and the second phase switches. The inverter further includes first phase AC power tabs to receive AC power from the first phase switches. The inverter further includes second phase AC power tabs to receive AC power from the second phase switches.

20 Claims, 24 Drawing Sheets

(56) References Cited

U.S. PATENT DOCUMENTS

| | | | |
|---|---|---|---|
| 2021/0257953 | A1 | 8/2021 | Kashiwazaki et al. |
| 2021/0296047 | A1 | 9/2021 | Covic et al. |
| 2022/0416711 | A1 | 12/2022 | Kim et al. |
| 2023/0096581 | A1 | 3/2023 | Takeuchi |
| 2023/0253908 | A1 | 8/2023 | Jeong et al. |
| 2023/0283214 | A1 | 9/2023 | Jeong et al. |
| 2023/0412106 | A1* | 12/2023 | You ..................... H01L 23/5385 |
| 2024/0039435 | A1 | 2/2024 | Jang et al. |
| 2024/0039448 | A1 | 2/2024 | Kim et al. |
| 2024/0047429 | A1* | 2/2024 | Lis ........................ H10W 90/00 |
| 2024/0048082 | A1 | 2/2024 | Lee et al. |
| 2024/0071860 | A1 | 2/2024 | Lin et al. |

FOREIGN PATENT DOCUMENTS

| | | | |
|---|---|---|---|
| CN | 111355420 | B | 3/2022 |
| CN | 116252648 | A | 6/2023 |
| CN | 117559875 | A | 2/2024 |
| DE | 10 2011 050 719 | A1 | 12/2012 |
| JP | 7258654 | B2 | 4/2023 |
| JP | 2023128078 | A | 9/2023 |
| WO | 2020035926 | A1 | 2/2020 |
| WO | 2023170817 | A1 | 9/2023 |

* cited by examiner

500

700

1600

SYSTEMS FOR POWER MODULE ASSEMBLY FOR INVERTER

CROSS REFERENCE TO RELATED APPLICATION(S)

This application claims the benefit of priority to U.S. Provisional Patent Application No. 63/562,673, filed Mar. 7, 2024, the entirety of which is incorporated by reference herein.

TECHNICAL FIELD

Various embodiments of the present disclosure relate generally to electrical inverters, and more particularly, but without limitation, to electrical inverters used in high voltage circuits such as electric vehicle applications.

BACKGROUND

Electrical inverters are widely used in high voltage applications, such as in electric vehicles. For example, electric vehicles typically employ multi-phase motors, which may use various winding configurations, which can be used to manipulate the torque and power output curves of a given motor by driving the motor in various configurations. Some inverter circuits for high voltage applications require additional high voltage cabling, complicated control, and generate excessive amounts of heat.

The present disclosure is directed to overcoming one or more of these challenges.

SUMMARY OF THE DISCLOSURE

In some aspects, the techniques described herein relate to a system including: an inverter to convert DC power from a voltage source to AC power to drive a motor, wherein the inverter includes: a first power module including: one or more first phase switches; one or more second phase switches; one or more positive DC power tabs connected to a positive DC rail to provide positive DC power to the one or more first phase switches and the one or more second phase switches; one or more negative DC power tabs connected to a negative DC rail to provide negative DC power to the one or more first phase switches and the one or more second phase switches; one or more first phase AC power tabs to receive AC power from the one or more first phase switches; and one or more second phase AC power tabs to receive AC power from the one or more second phase switches.

In some aspects, the techniques described herein relate to a system, wherein the first power module further includes: a flex circuit including an insulating material and an electrically conductive material.

In some aspects, the techniques described herein relate to a system, wherein the first power module further includes: a thermistor connected to the flex circuit.

In some aspects, the techniques described herein relate to a system, wherein the first power module further includes: a changeover switch to change a connection of the one or more first phase switches and the one or more second phase switches with a first winding of the motor.

In some aspects, the techniques described herein relate to a system, wherein the first power module further includes: a first substrate having an outer surface and an inner surface; a second substrate having an outer surface and an inner surface; and an electrically conductive spacer coupled to the inner surface of the first substrate and to the inner surface of the second substrate, wherein the one or more first phase switches and the one or more second phase switches are coupled to the inner surface of the first substrate and to the inner surface of the second substrate.

In some aspects, the techniques described herein relate to a system, wherein: the first power module is configured to drive a first AC phase of the motor, and the inverter further includes: a second power module to drive a second AC phase of the motor; and a third power module to drive a third AC phase of the motor.

In some aspects, the techniques described herein relate to a system, wherein the inverter further includes: a capacitor.

In some aspects, the techniques described herein relate to a system, wherein the inverter further includes: a heat sink.

In some aspects, the techniques described herein relate to a system, further including: the voltage source to supply the DC power to the inverter; and the motor to receive the AC power from the inverter to drive the motor, wherein the system is provided as a vehicle including the inverter, the voltage source, and the motor.

In some aspects, the techniques described herein relate to a system including a power module for an inverter, the power module including: one or more first phase switches; one or more second phase switches; one or more positive DC power tabs connected to a positive DC rail to provide positive DC power to the one or more first phase switches and the one or more second phase switches; one or more negative DC power tabs connected to a negative DC rail to provide negative DC power to the one or more first phase switches and the one or more second phase switches; one or more first phase AC power tabs to receive AC power from the one or more first phase switches; and one or more second phase AC power tabs to receive AC power from the one or more second phase switches.

In some aspects, the techniques described herein relate to a system, wherein the power module further includes: a flex circuit including an insulating material and an electrically conductive material; and a thermistor connected to the flex circuit.

In some aspects, the techniques described herein relate to a system, wherein the power module further includes: a changeover switch to change a connection of the one or more first phase switches and the one or more second phase switches with a winding of a motor.

In some aspects, the techniques described herein relate to a system, wherein the power module further includes: one or more neutral power tabs.

In some aspects, the techniques described herein relate to a system, wherein one or more of the one or more first phase switches or the one or more second phase switches includes silicon carbide.

In some aspects, the techniques described herein relate to a system, wherein the power module further includes: one or more signal pins.

In some aspects, the techniques described herein relate to a system, wherein the power module further includes: a first substrate having an outer surface and an inner surface; a second substrate having an outer surface and an inner surface; and an electrically conductive spacer coupled to the inner surface of the first substrate and to the inner surface of the second substrate, wherein the one or more first phase switches and the one or more second phase switches are coupled to the inner surface of the first substrate and to the inner surface of the second substrate.

In some aspects, the techniques described herein relate to a system, wherein: the one or more first phase switches include a first upper phase switch and a first lower phase switch, the one or more second phase switches include a second upper phase switch and a second lower phase switch, the one or more positive DC power tabs include a first positive DC power tab for the first upper phase switch and a second positive DC power tab for the second upper phase switch, and the one or more negative DC power tabs include a first negative DC power tab for the first lower phase switch and a second negative DC power tab for the second lower phase switch.

In some aspects, the techniques described herein relate to a system including: an inverter to convert DC power from a voltage source to AC power to drive a motor, wherein the inverter includes: a first power module to drive a first AC phase of the motor; a second power module to drive a second AC phase of the motor; and a third power module to drive a third AC phase of the motor, wherein each of the first power module, the second power module, and the third power module includes: one or more first phase switches; one or more second phase switches; one or more positive DC power tabs connected to a positive DC rail to provide positive DC power to the one or more first phase switches and the one or more second phase switches; one or more negative DC power tabs connected to a negative DC rail to provide negative DC power to the one or more first phase switches and the one or more second phase switches; one or more first phase AC power tabs to receive AC power from the one or more first phase switches; and one or more second phase AC power tabs to receive AC power from the one or more second phase switches.

In some aspects, the techniques described herein relate to a system, wherein each of the first power module, the second power module, and the third power module further includes: one or more neutral power tabs.

In some aspects, the techniques described herein relate to a system, wherein the inverter further includes: a heat sink provided on a first side of the first power module, the second power module, and the third power module; and one or more capacitors provided on a second side of the first power module, the second power module, and the third power module, the second side opposite from the first side.

In some aspects, the techniques described herein relate to a system including: an inverter to convert DC power from a voltage source to AC power to drive a winding of a motor, wherein the inverter includes: a first power module including: a first inverter to be connected to a first end of the winding and to be connected to the voltage source, wherein the first inverter is configured to output first AC power to the first end of the winding; a second inverter to be connected to a second end of the winding and to be connected to the voltage source, wherein the second inverter is configured to output second AC power to the second end of the winding; and a changeover switch to selectively connect and disconnect the second end of the winding to and from a neutral connection.

In some aspects, the techniques described herein relate to a system, wherein the changeover switch is further configured to change a configuration of the winding from Delta to Wye or from Wye to Delta.

In some aspects, the techniques described herein relate to a system, wherein the first inverter is a first half bridge inverter and the second inverter is a second half bridge inverter.

In some aspects, the techniques described herein relate to a system, wherein: the first inverter includes one or more first upper phase switches and one or more first lower phase switches, and the second inverter includes one or more second upper phase switches and one or more second lower phase switches.

In some aspects, the techniques described herein relate to a system, wherein: the first inverter includes three upper phase switches and three lower phase switches to drive a first winding of the motor, and the second inverter includes three upper phase switches and three lower phase switches to drive the first winding of the motor.

In some aspects, the techniques described herein relate to a system, wherein the inverter further includes one or more controllers to control an operation of the first inverter, the second inverter, and the changeover switch.

In some aspects, the techniques described herein relate to a system, wherein: the first power module is configured to drive a first winding of the motor, and the inverter further includes: a second power module to drive a second winding of the motor; and a third power module to drive a third winding of the motor.

In some aspects, the techniques described herein relate to a system, wherein the inverter further includes: a capacitor.

In some aspects, the techniques described herein relate to a system, further including: the voltage source configured to supply the DC power to the inverter; and the motor configured to receive the AC power from the inverter to drive the motor, wherein the system is provided as a vehicle including the inverter, the voltage source, and the motor.

In some aspects, the techniques described herein relate to a system including a power module for an inverter, the power module including: a first inverter to be connected to a first end of a winding of a motor and to be connected to a voltage source, wherein the first inverter is configured to output first AC power to the first end of the winding; a second inverter to be connected to a second end of the winding and to be connected to the voltage source, wherein the second inverter is configured to output second AC power to the second end of the winding; and a changeover switch to selectively connect and disconnect the second end of the winding to and from a neutral connection.

In some aspects, the techniques described herein relate to a system, wherein the changeover switch is further configured to change a configuration of the winding from Delta to Wye or from Wye to Delta.

In some aspects, the techniques described herein relate to a system, wherein the first inverter is a first half bridge inverter and the second inverter is a second half bridge inverter.

In some aspects, the techniques described herein relate to a system, wherein: the first inverter includes three upper phase switches and three lower phase switches to drive the winding of the motor, and the second inverter includes three upper phase switches and three lower phase switches to drive the winding of the motor.

In some aspects, the techniques described herein relate to a system, wherein the changeover switch includes four switches.

In some aspects, the techniques described herein relate to a system, wherein the second inverter is configured to be disabled below a power threshold to reduce switching loss of the power module.

In some aspects, the techniques described herein relate to a system, wherein the changeover switch is configured to provide a current return path from the winding of the motor to the neutral connection when the second inverter is disabled.

In some aspects, the techniques described herein relate to a system, wherein the changeover switch is configured to provide a connection to the winding of the motor for boost voltage during charging of the voltage source.

In some aspects, the techniques described herein relate to a system including: an inverter to convert DC power from a voltage source to AC power to drive a motor, wherein the inverter includes: a first power module to drive a first winding of the motor; a second power module to drive a second winding of the motor; and a third power module to drive a third winding of the motor, wherein each of the first power module, the second power module, and the third power module includes: a first inverter to be connected to a first end of a respective winding of the motor and to be connected to a voltage source, wherein the first inverter is configured to output first AC power to the first end of the respective winding; a second inverter to be connected to a second end of the respective winding and to be connected to the voltage source, wherein the second inverter is configured to output second AC power to the second end of the respective winding; and a changeover switch to selectively connect and disconnect the second end of the respective winding to and from a neutral connection.

In some aspects, the techniques described herein relate to a system, wherein: each first inverter is a first half bridge inverter including three upper phase switches and three lower phase switches, and each second inverter is a second half bridge inverter including three upper phase switches and three lower phase switches.

In some aspects, the techniques described herein relate to a system, wherein the inverter is configured to operate in a first configuration with each second inverter is disabled, and a second configuration with each first inverter and each second inverter enabled.

In some aspects, the techniques described herein relate to a system including: an inverter to convert DC power from a voltage source to AC power to drive a motor, wherein the inverter includes: a capacitor assembly; and a first power module including: a first inverter to output first AC power to a first end of a first winding of the motor; a second inverter to output second AC power to a second end of the first winding; and a changeover switch to selectively connect and disconnect the second end of the first winding to and from a neutral connection.

In some aspects, the techniques described herein relate to a system, wherein the capacitor assembly includes: one or more busbars; and one or more capacitors.

In some aspects, the techniques described herein relate to a system, wherein the one or more capacitors include: a first capacitor for the first inverter; and a second capacitor for the second inverter.

In some aspects, the techniques described herein relate to a system, wherein the one or more busbars include: a positive busbar connected to the one or more capacitors and the first power module; and a negative busbar connected to the one or more capacitors and the first power module.

In some aspects, the techniques described herein relate to a system, wherein the one or more busbars further include: a neutral busbar connected to the neutral connection of the first power module.

In some aspects, the techniques described herein relate to a system, wherein: the first power module is configured to drive the first winding of the motor, and the inverter further includes: a second power module to drive a second winding of the motor; and a third power module to drive a third winding of the motor.

In some aspects, the techniques described herein relate to a system, wherein the one or more capacitors include: a first capacitor for the first inverter of the first power module; a second capacitor for the second inverter of the first power module; a third capacitor for a first inverter of the second power module; a fourth capacitor for a second inverter of the second power module; a fifth capacitor for a first inverter of the third power module; and a sixth capacitor for a second inverter of the third power module.

In some aspects, the techniques described herein relate to a system, wherein: the positive busbar is further connected to the second power module and the third power module; and the negative busbar is further connected to the second power module and the third power module.

In some aspects, the techniques described herein relate to a system, further including: the voltage source configured to supply the DC power to the inverter; and the motor configured to receive the AC power from the inverter to drive the motor, wherein the system is provided as a vehicle including the inverter, the voltage source, and the motor.

In some aspects, the techniques described herein relate to a system including: an inverter to convert DC power from a voltage source to AC power to drive a motor, wherein the inverter includes: a capacitor assembly; and a power module including: a first inverter to output first AC power to a first end of a first winding of the motor; and a second inverter to output second AC power to a second end of the first winding.

In some aspects, the techniques described herein relate to a system, wherein the capacitor assembly includes: one or more busbars; and one or more capacitors.

In some aspects, the techniques described herein relate to a system, wherein the one or more capacitors include: a first capacitor for the first inverter; and a second capacitor for the second inverter.

In some aspects, the techniques described herein relate to a system, wherein the one or more busbars include: a positive busbar connected to the one or more capacitors and a positive connection of the power module; and a negative busbar connected to the one or more capacitors and a negative connection of the power module.

In some aspects, the techniques described herein relate to a system, wherein the one or more busbars further include: a neutral busbar connected to a neutral connection of the power module.

In some aspects, the techniques described herein relate to a system, wherein the power module includes: one or more positive power tabs connected to positive busbar; one or more negative power tabs connected to negative busbar; and one or more neutral tabs connected to neutral busbar.

In some aspects, the techniques described herein relate to a system, wherein each of the positive busbar, the negative busbar, and the neutral busbar includes a respective connection tab on a same side of the capacitor assembly.

In some aspects, the techniques described herein relate to a system, wherein the power module further includes: a changeover switch to selectively connect and disconnect the second end of the first winding to and from a neutral connection.

In some aspects, the techniques described herein relate to a system including: an inverter to convert DC power from a voltage source to AC power to drive a motor, wherein the inverter includes: a capacitor assembly including one or more busbars and one or more capacitors; a first power module to drive a first winding of the motor; a second power module to drive a second winding of the motor; and a third power module to drive a third winding of the motor, wherein each of the first power module, the second power module, and the third power module includes: a first inverter to output first AC power to a first end of the respective winding; a second inverter to output second AC power to a second end of the respective winding; and a changeover switch to selectively connect and disconnect the second end of the respective winding to and from a neutral connection.

In some aspects, the techniques described herein relate to a system, wherein each of the first power module, the second power module, and the third power module further includes: one or more power tabs connected to the one or more capacitors via the one or more busbars.

In some aspects, the techniques described herein relate to a system, wherein the inverter further includes: a heat sink provided on a first side of the first power module, the second power module, and the third power module, wherein the capacitor assembly is provided on a second side of the first power module, the second power module, and the third power module, the second side opposite from the first side.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
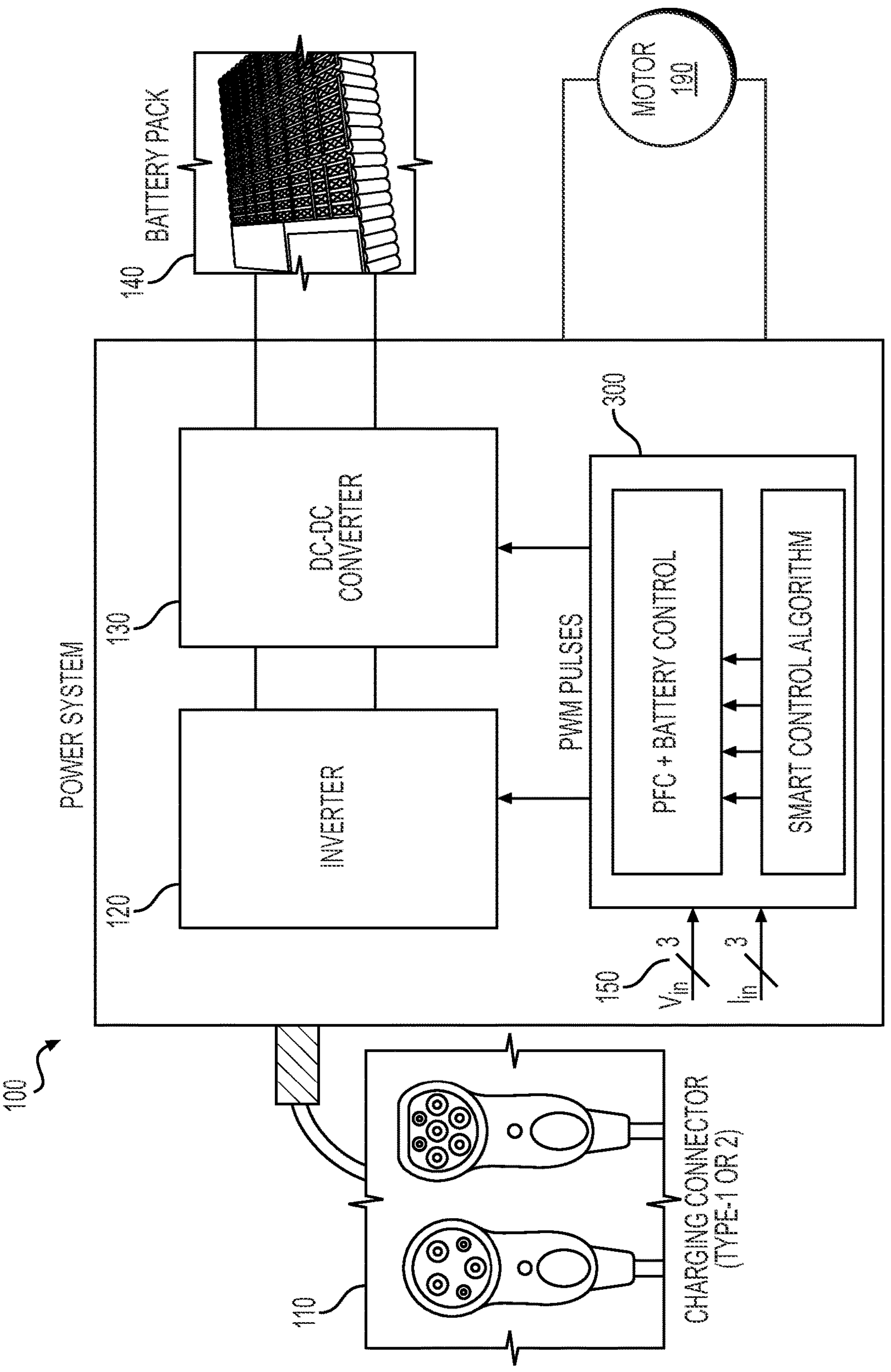
FIG. 1 depicts an exemplary system infrastructure for a power system for an electric vehicle, according to one or more embodiments.

Both the foregoing general description and the following detailed description are exemplary and explanatory only and are not restrictive of the features, as claimed. As used herein, the terms “comprises,” “comprising,” “has,” “having,” “includes,” “including,” or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, “about,” “substantially,” and “approximately” are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Various embodiments of the present disclosure relate generally to inverters, and more particularly, but without limitation, to inverter circuits used in high voltage circuits such as motors, or e-machines, in electric vehicles, and packages for inverter circuits.

As discussed above, electrical inverters are widely used in high voltage applications, such as for driving motors of electric vehicles. Motors are wound with electrical windings which may be connected with each other and with the power source(s) in various winding configurations. Examples include Wye ("Y"), Open Ended Winding (OEW), and Delta configurations. Switching winding configuration and/or applying one or both inverters of an open ended winding configuration may provide technical advantages such as an ability to adjust motor torque or power. But such switching circuits may pose disadvantages such as increased heat or length of high voltage cabling.

One or more embodiments may address these concerns. For example, disclosed systems include switchable inverter circuits that facilitate reconfiguration of inverters to and from different winding configurations, integrated power modules that include such switchable inverters, and integrated packages that include multiple power modules with thermal management. While the examples discussed herein describe electrical inverters for use in driving electric motors and/or in battery charging circuits, the disclosure is not limited thereto. Rather, the disclosed inverters may be used in any circuit.

Open coil motors may achieve similar power outputs using half the current required for some delta or Y connected motors. This is due to the ability to apply the full bus voltage across the winding rather than just half the bus voltage. In other words, one half of the sine wave is above the neutral point, and one half is below the neutral point. This may be done having the two inverters operating 180 degrees out of phase. However, the penalty for doing this is increased high voltage cabling, more complicated control, and a coordination problem during fault conditions. To address the coordination problem, both inverters may be installed within a single housing. Housing the inverters together allows more efficient fault safety logic and more tightly coupled control. However, increasing the number of switches also increases the required volume, and complicates the cooling and bus routing. Each of the six phases would have relative creepage and clearance requirements.

One or more embodiments may provide a highly integrated power switch and/or module topology that enables simplification of the internal dual inverter assembly, as a mitigation for increased complexity produced, with an open coil motor. One or more embodiments may provide a system partitioning, and a packaging strategy enabled by flex on substrate technology. The partitioning portion may group both coil A half bridges, both coil B half bridges, and both coil C half bridges. Each group is then integrated into a single power switch module.

One or more embodiments may provide a module that includes two half bridges including an upper power switch with three parallel SiC MOSFETs, a lower power switch with three parallel SiC MOSFETs, and a change-over switch with two sets (e.g., four switches) of parallel SiC MOSFETs in a back-to-back configuration. The back-to-back configuration may be used to block reverse current during the various operation scenarios. The N terminal change-over switch may only conduct when fully enhanced, when in mode two or three, or completely off as in mode one. The N terminal change-over switch is not intended for fast switching having fewer parallel MOSFETs.

The number of SiC FETs required per upper or lower section of the half bridge and change over switch may be dependent upon the total current and/or power requirement of the system. One or more embodiments may provide three parallel SiC die per switch. One or more embodiments may provide an operation mode one, with the highest power output, used during vehicle launch and at high speeds. During this scenario, both inverters are operational. The duty cycle controlling the sinusoidal current for inverter one would be 180 degrees out of phase from that controlling current on inverter two. Therefore, under static conditions, the duty cycle of inverter one is one minus the duty cycle of inverter two. Efficiency (conduction losses) in mode one, may be improved over some inverter topologies in that the voltage being switched across a SiC die would still be 800V, but the current would be half that of some inverters for comparable power delivery. The switch configuration may be operated under an alternate mode during reduced load situations, with the intent to increase efficiency.

One or more embodiments may provide an operation mode two, with low power output (e.g., below a power threshold), such as a vehicle operated at highway speeds under steady state conditions. The second inverter would be disabled, and the change-over switch is activated to provide a current return path. When NA is tied to NB and NC, with the second inverter disabled, the N connection will float to a voltage of the neutral point of a Y connected inverter at half the bus voltage.

Transitioning from mode one to mode two may require the forcing voltage produced by inverter two to decrease, while increasing the voltage produce by inverter one and maintaining the same inverter setpoint. When inverter two approaches 50% duty cycle, the second inverter may be disengaged, and the change-over switch engaged, which may reduce unwanted motor torque. Transitioning from mode two to mode one would be the opposite situation.

One or more embodiments may provide an operation mode three. If the vehicle was not in an operating mode, and the N terminal was provided with a positive voltage with respect to HV−, the change-over switch may be activated and inverter one may be used to boost the battery voltage. To maintain zero torque on the motor, the inverter may be duty cycled from active short circuit lower (all lower switches on) to active short circuit upper (all upper switches on).

One or more embodiments may provide an inverter design with NA tied to B2, NB tied to C2, and NC tied to A2. If inverter one is operational, inverter two is disabled, and with the change-over switch activated as in mode two. The inverter may drive the motor as if configured as a delta wound machine.

One or more embodiments may provide a switch module having an over molded exterior with features for increasing the creepage distance between terminals. One or more embodiments may provide two substrates having a thermally conductive interface to both sides of the SiC die. One or more embodiments may provide a second metal layer embedded within a polyimide flex circuit laminated onto the source substrate providing gate routing. One or more embodiments may provide a flex circuit having via features connecting flex signal trace to the underlying plane.

One or more embodiments may provide substrates carrying 16 SiC die with the sources connected to the underlying plane while the gate interconnect is connected to the flex circuit on second metal. The drains are then connected to the opposing substrate plane. Interconnects may be provided with soldering or sintering. One or more embodiments may provide a substrate to substrate interconnect using electrically conductive spacers. One or more embodiments may provide thermistors for thermal management. One or more embodiments may provide a lead frame providing interconnect to the rest of the inverter. One or more embodiments may provide an integrated architecture in a thick copper (high current), low inductance, double side cooled design.

One or more embodiments may provide a power module including three power module switch assemblies, and a cooling rail. One or more embodiments may provide a switch assembly sandwiched between two halves of the cooling rail. One or more embodiments may provide a power flow into the power connections, then into the capacitor assembly with integrated busbars, across the busbars, then into the terminals of the power module, and exiting the power module across the busbar assembly, then to the load at the phase terminals.

One or more embodiments may mitigate an increased complexity of the inverter assembly is with an increased number of interconnects. One or more embodiments may provide a bulk capacitor assembly with busbars with an additional plate in order to route the N signal away from the power modules. One or more embodiments may provide a phase connection busbar assembly that accommodates cross over interconnects if inverter one and inverter two outputs are ordered by inverter.

One or more embodiments may provide an open coil Y connected motor being driven by two inverters. One or more embodiments may provide packaging for a two-inverter solution for an open coil motor design. One or more embodiments may provide a two inverter open coil design. One or more embodiments may provide a power switch configuration with a switch for turning off one or the other inverters to save switching loss at lower power levels. One or more embodiments may provide a power switch configuration that provides a current return path for the motor winding to a neutral path in the case that the motor is being driven by only one inverter. One or more embodiments may provide a switch to provide a path through the motor winding for boost voltage during charging.

One or more embodiments may provide reduced cooling rails and interconnects. One or more embodiments may provide reduced overall volume. One or more embodiments may provide power flows in from the external terminals on the right side into the capacitor. One or more embodiments may provide a bulk capacitor assembly that has busbars with an additional plate in order to route the N signal away from the power modules. One or more embodiments may provide a path where power flows into the power switches and is chopped into a sinusoidal voltage that is then applied to both sides of the coil loads. One or more embodiments may provide an integrated module that allows for decreased volume. One or more embodiments may provide lower loop inductance that may provide better switching characteristics. One or more embodiments may provide a highly integrated switch topology using flex on substrate. One or more embodiments may provide a bulk capacitor with an additional plate.

FIG. 1 depicts an exemplary system infrastructure for a power system for an electric vehicle, according to one or more embodiments. As explained herein, power system 100 may perform functions such as charging battery pack 140 or powering an electric vehicle via motor 190.

As depicted in FIG. 1, power system 100 may include or be electrically connectable to a charging connector 110. The charging connector 110 may provide an electrical connection from an external power supply to the power system 100, and may be a Type 1 or a Type 2 connector, for example. The charging connector 110 may transfer single phase, two-phase, or three phase power.

The power system 100 may include one or more of an inverter 120, an HV DC-DC converter 130, and a controller 300 receiving signals from input sensor 150. Inverter 120 may convert DC, for example, provided by battery pack 140, to AC in one or more phases for driving motor 190. As explained herein, various inverter configurations are possible. For instance, power system 100 may include circuits as depicted herein. As discussed, these circuits may reconfigure a connection of the windings used to energize motor 190 as needs change. In some cases, power system 100 may include a Power Factor Correction (PFC) converter (not depicted). The PFC converter may be an AC-DC converter. HV DC-DC converter 130 may be a DC-DC converter.

Controller 300 may include one or more controllers such as processors. The power system 100 may include or be electrically connectable to a battery pack 140. The power system 100 may be used in automotive vehicles as an onboard charger to transfer power from an external power source through charging connector 110 to battery pack 140 in a grid-to-battery operation, or to transfer power from battery pack 140 in a vehicle to grid configuration (a battery-to-grid operation). The power system 100 may be included in a system provided as an electric vehicle including a motor 190 configured to rotate based on power received from the battery pack 140.

Figure 2:
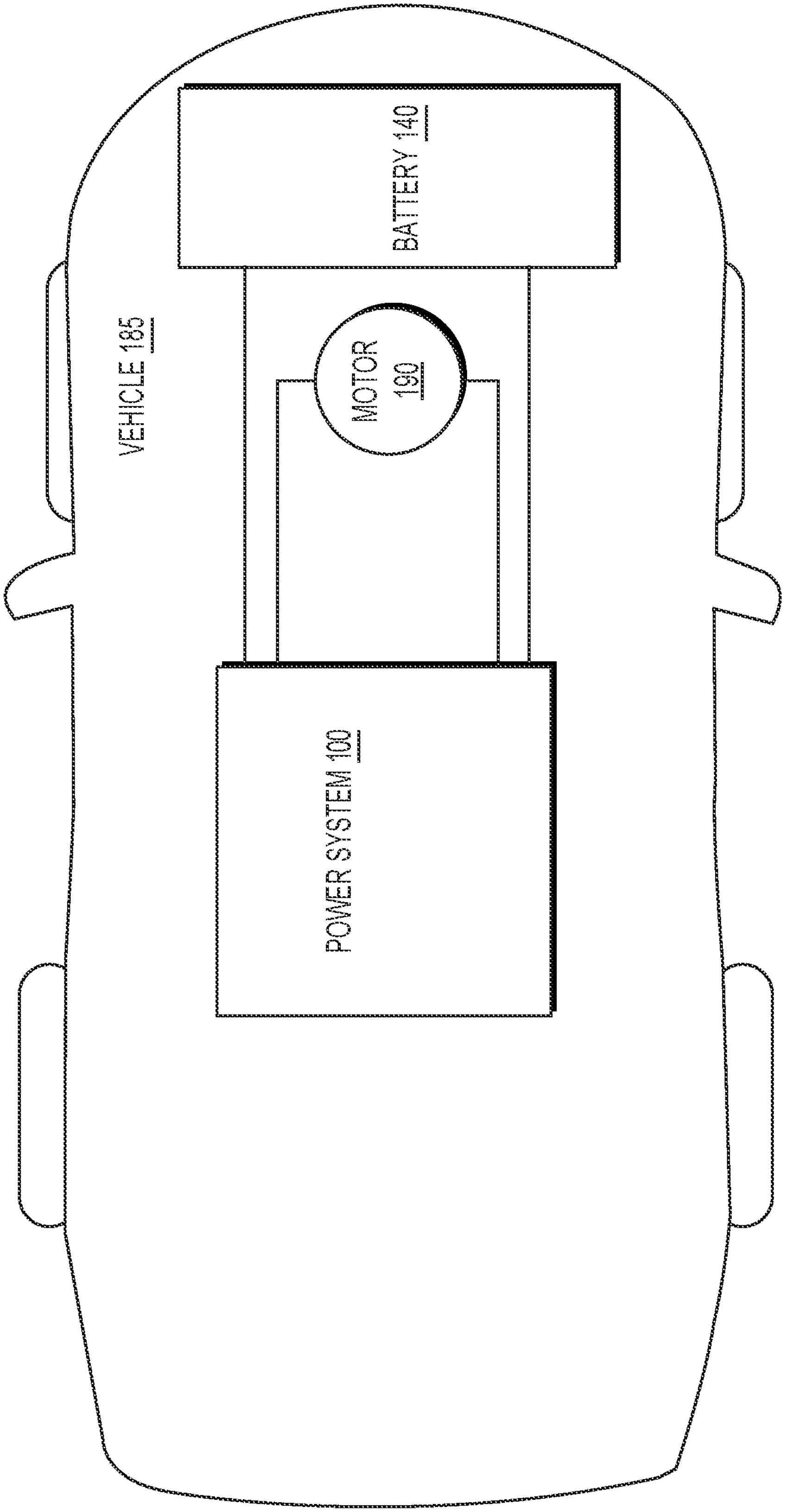
FIG. 2 depicts an exemplary system infrastructure for a vehicle including an inverter, according to one or more embodiments.

FIG. 2 depicts an exemplary system infrastructure for a vehicle including a battery charger, according to one or more embodiments. As discussed, power system 100 may include an inverter and/or a battery charger. As depicted in FIG. 2, electric vehicle 185 may include power system 100, motor 190, and battery pack 140.

Power system 100 may include components to receive electrical power from an external source and output electrical power to charge battery pack 140 of electric vehicle 185. Power system 100 may convert DC power from battery pack 140 in electric vehicle 185 to AC power, to drive motor 190 of the electric vehicle 185, for example, but the embodiments are not limited thereto. For example, power system 100 may include components to receive electrical power from an external source and output electrical power to charge battery pack 140 without motor 190 connected to power system 100. Power system 100 may convert DC power from battery pack 140 in electric vehicle 185 to AC power, to drive AC components other than motor 190 of the electric vehicle 185. Power system 100 may be bidirectional, and may convert DC power to AC power, or convert AC power to DC power, such as during regenerative braking, for example. Power system 100 may be a three-phase inverter, a single-phase inverter, or a multi-phase inverter.

Figure 3:
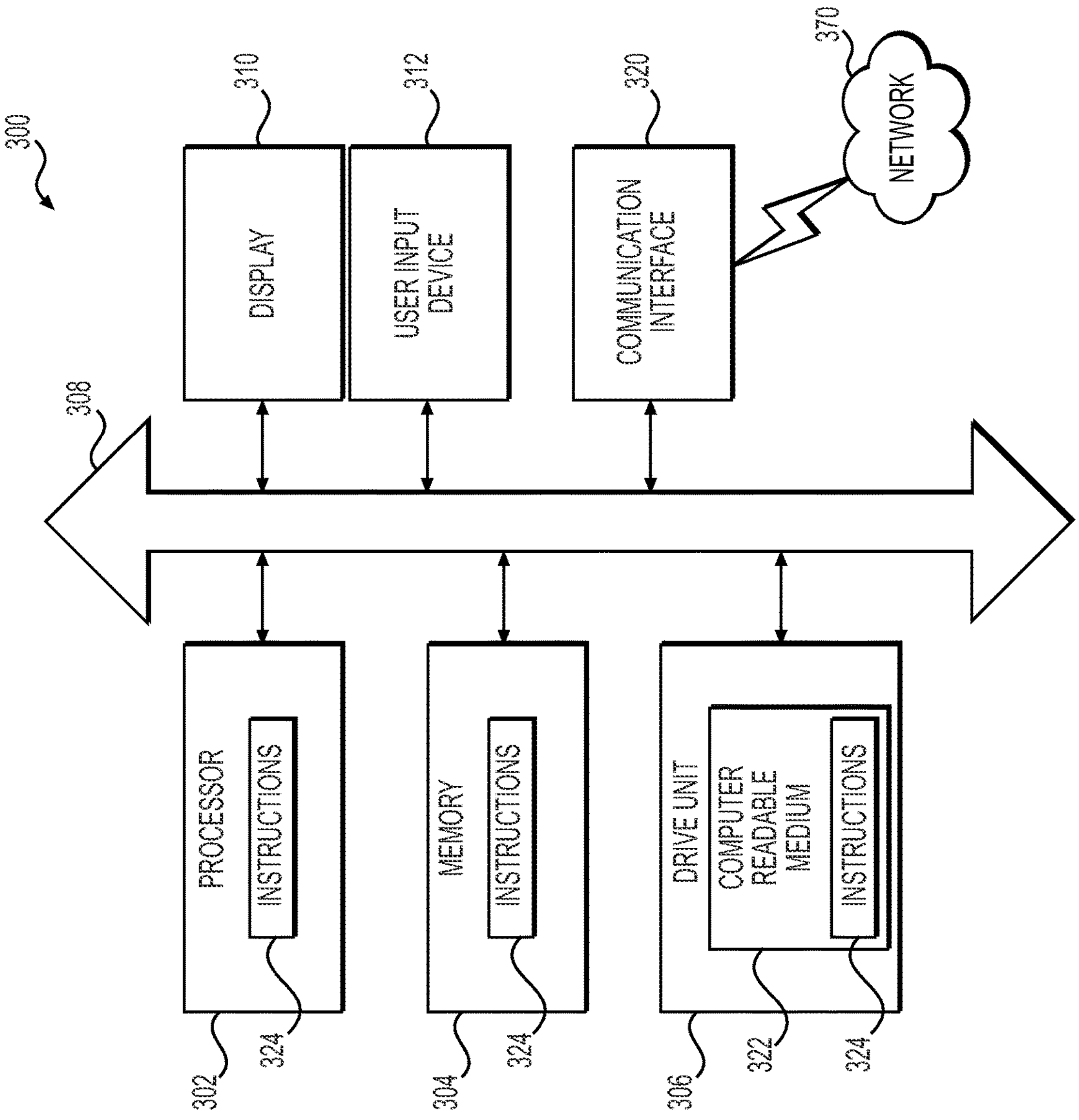
FIG. 3 depicts an implementation of a computer system that may execute techniques presented herein, according to one or more embodiments.

FIG. 3 depicts an implementation of a controller 300 that may execute techniques presented herein, according to one or more embodiments. For example, controller 300 may control one or more configurations of the circuits discussed herein.

Any suitable system infrastructure may be put into place to allow control of the battery charger. FIG. 3 and the following discussion provide a brief, general description of a suitable computing environment in which the present disclosure may be implemented. In one embodiment, any of the disclosed systems, methods, and/or graphical user interfaces may be executed by or implemented by a computing system consistent with or similar to that depicted in FIG. 3. Although not required, embodiments of the present disclosure are described in the context of computer-executable instructions, such as routines executed by a data processing device, e.g., a server computer, wireless device, and/or personal computer. Those skilled in the relevant art will appreciate that embodiments of the present disclosure can be practiced with other communications, data processing, or computer system configurations, including: Internet appliances, hand-held devices (including personal digital assistants ("PDAs")), wearable computers, all manner of cellular or mobile phones (including Voice over IP ("VoIP") phones), dumb terminals, media players, gaming devices, virtual reality devices, multi-processor systems, microprocessorbased or programmable consumer electronics, set-top boxes, network PCs, mini-computers, mainframe computers, and the like. Indeed, the terms "computer," "server," and the like, are generally used interchangeably herein, and refer to any of the above devices and systems, as well as any data processor.

Embodiments of the present disclosure may be embodied in a special purpose computer and/or data processor that is specifically programmed, configured, and/or constructed to perform one or more of the computer-executable instructions explained in detail herein. While embodiments of the present disclosure, such as certain functions, are described as being performed exclusively on a single device, the present disclosure may also be practiced in distributed environments where functions or modules are shared among disparate processing devices, which are linked through a communications network, such as a Local Area Network ("LAN"), Wide Area Network ("WAN"), and/or the Internet. Similarly, techniques presented herein as involving multiple devices may be implemented in a single device. In a distributed computing environment, program modules may be located in both local and/or remote memory storage devices.

Embodiments of the present disclosure may be stored and/or distributed on non-transitory computer-readable media, including magnetically or optically readable computer discs, hard-wired or preprogrammed chips (e.g., EEPROM semiconductor chips), nanotechnology memory, biological memory, or other data storage media. Alternatively, computer implemented instructions, data structures, screen displays, and other data under embodiments of the present disclosure may be distributed over the Internet and/or over other networks (including wireless networks), on a propagated signal on a propagation medium (e.g., an electromagnetic wave(s), a sound wave, etc.) over a period of time, and/or they may be provided on any analog or digital network (packet switched, circuit switched, or other scheme).

The controller 300 may include a set of instructions that may be executed to cause the controller 300 to perform any one or more of the methods or computer-based functions disclosed herein. The controller 300 may operate as a standalone device or may be connected, e.g., using a network, to other computer systems or peripheral devices.

In a networked deployment, the controller 300 may operate in the capacity of a server or as a client in a server-client user network environment, or as a peer computer system in a peer-to-peer (or distributed) network environment. The controller 300 may also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the controller 300 may be implemented using electronic devices that provide voice, video, or data communication. Further, while the controller 300 is illustrated as a single system, the term "system" shall also be taken to include any collection of systems or sub-systems that individually or jointly execute a set, or multiple sets, of instructions to perform one or more computer functions.

As illustrated in FIG. 3, the controller 300 may include a processor 302, e.g., a central processing unit (CPU), a graphics processing unit (GPU), or both. The processor 302 may be a component in a variety of systems. For example, the processor 302 may be part of a standard computer. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The controller 300 may include a memory 304 that may communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As depicted, the controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the controller 300 may include an input device 312 configured to allow a user to interact with any of the components of controller 300. The input device 312 may be a number pad, a keyboard, or a cursor control device, such as a mouse, or a joystick, touch screen display, remote control, or any other device operative to interact with the controller 300.

The controller 300 may also or alternatively include drive unit 306 implemented as a disk or optical drive. The drive unit 306 may include a computer-readable medium 322 in which one or more sets of instructions 324, e.g. software, may be embedded. Further, the instructions 324 may embody one or more of the methods or logic as described herein. The instructions 324 may reside completely or partially within the memory 304 and/or within the processor 302 during execution by the controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 may communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in controller 300, or combinations thereof. The connection with the network 370 may be a physical connection, such as a wired Ethernet connection or may be established wirelessly as discussed below. Likewise, the additional connections with other components of the controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 may include a solid-state memory such as a memory card or other package that houses one or more non-volatile read-only memories. The computer-readable medium 322 may be a random-access memory or other volatile re-writable memory. Additionally or alternatively, the computer-readable medium 322 may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, may be constructed to implement one or more of the methods described herein. Applications that may include the apparatus and systems of various implementations may broadly include a variety of electronic and computer systems. One or more implementations described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

The controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations may include distributed processing, component/object distributed processing, and parallel processing. Alternatively, virtual computer system processing may be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, and HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

As discussed, certain aspects relate to improved inverters and power modules that may simplify electronics and improve thermal management associated with the switchable configuration of open coil windings and various winding configurations. In so doing, certain aspects may enable improved electric vehicle systems.

Figure 4:
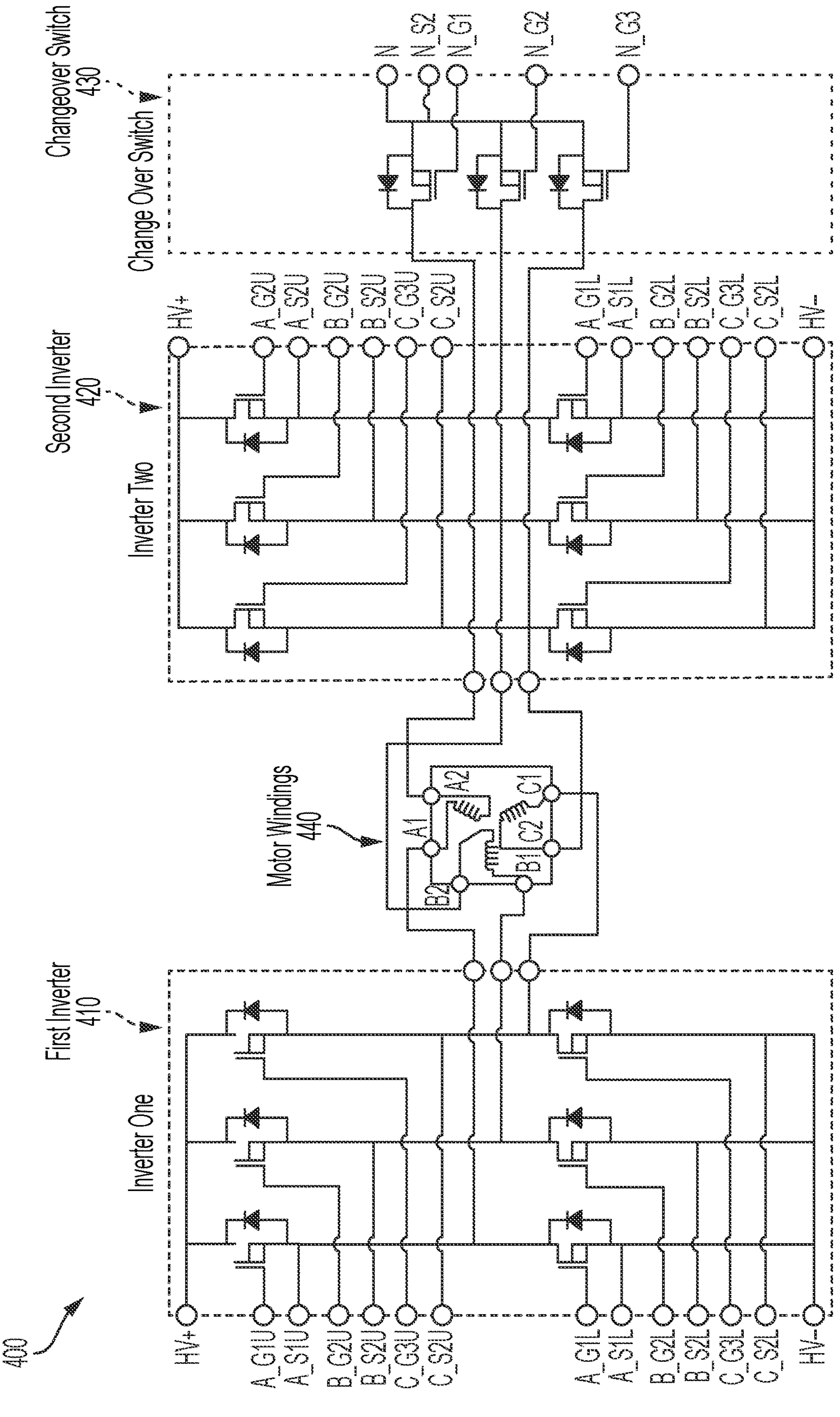
FIG. 4 depicts an exemplary electrical schematic of a switchable inverter circuit, according to one or more embodiments.

FIG. 4 depicts an exemplary electrical schematic of a switchable inverter circuit 400, according to one or more embodiments. In the example depicted, switchable inverter circuit 400 (also referred to as a power switch module) uses changeover switch 430 to manage operation of first inverter 410, second inverter 420, and a configuration of motor windings 440. Inverter circuit 400 may be reconfigured, via changeover switch 430, to provide power to motor windings 440 in either a Wye or a Delta winding configuration. Inverter circuit 400 may be reconfigured, also via changeover switch 430, to provide power from one or both of first inverter 410 and second inverter 420. Changeover switch 430 may selectively connect and disconnect the second end of the motor windings 440 to and from a neutral connection.

In a first use case, changeover switch 430 configures motor windings 440 to be in a Wye mode, such that the motor windings 440 receive power from both the first inverter 410 and second inverter 420. In this mode, the voltages provided by first inverter 410 and second inverter 420 may be out-of-phase from each other. In this case, the A1 and B2 connection points are connected, the B1 and C2 connection points are connected, and the C1 and A2 connection points are connected.

Figure 5:
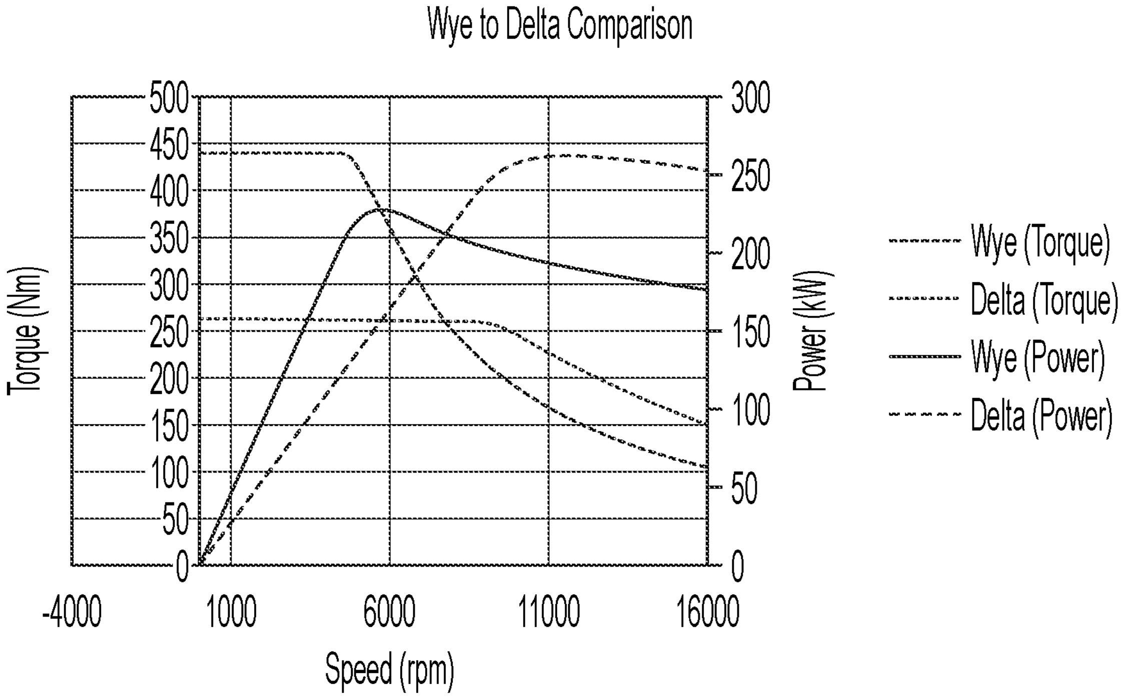
FIG. 5 depicts a graph illustrating examples of torque and power output for various configurations of motor windings, according to one or more embodiments.

In a second use case, changeover switch 430 configures motor windings 440 to be in a Delta mode, receiving power from only the first inverter 410. In this case, the second inverter 420 is bypassed. Other use cases are possible. Different winding configurations may have different technical advantages. For example, the Wye configuration may be used at lower motor speeds, whereas the Delta configuration may be used at higher speeds. FIG. 5 illustrates some of these advantages.

FIG. 5 depicts a graph 500 illustrating examples of torque and power output for various configurations of motor windings, according to one or more embodiments. Graph 500 depicts both torque (left) and power (right) of both Wye and Delta winding configurations. As can be seen, the Wye configuration may provide greater torque at low rotational speeds than the Delta configuration. But at higher speed, the Delta configuration may provide increased power relative to the Wye configuration. Accordingly, disclosed systems may adjust the winding configuration as needed.

Figure 6:
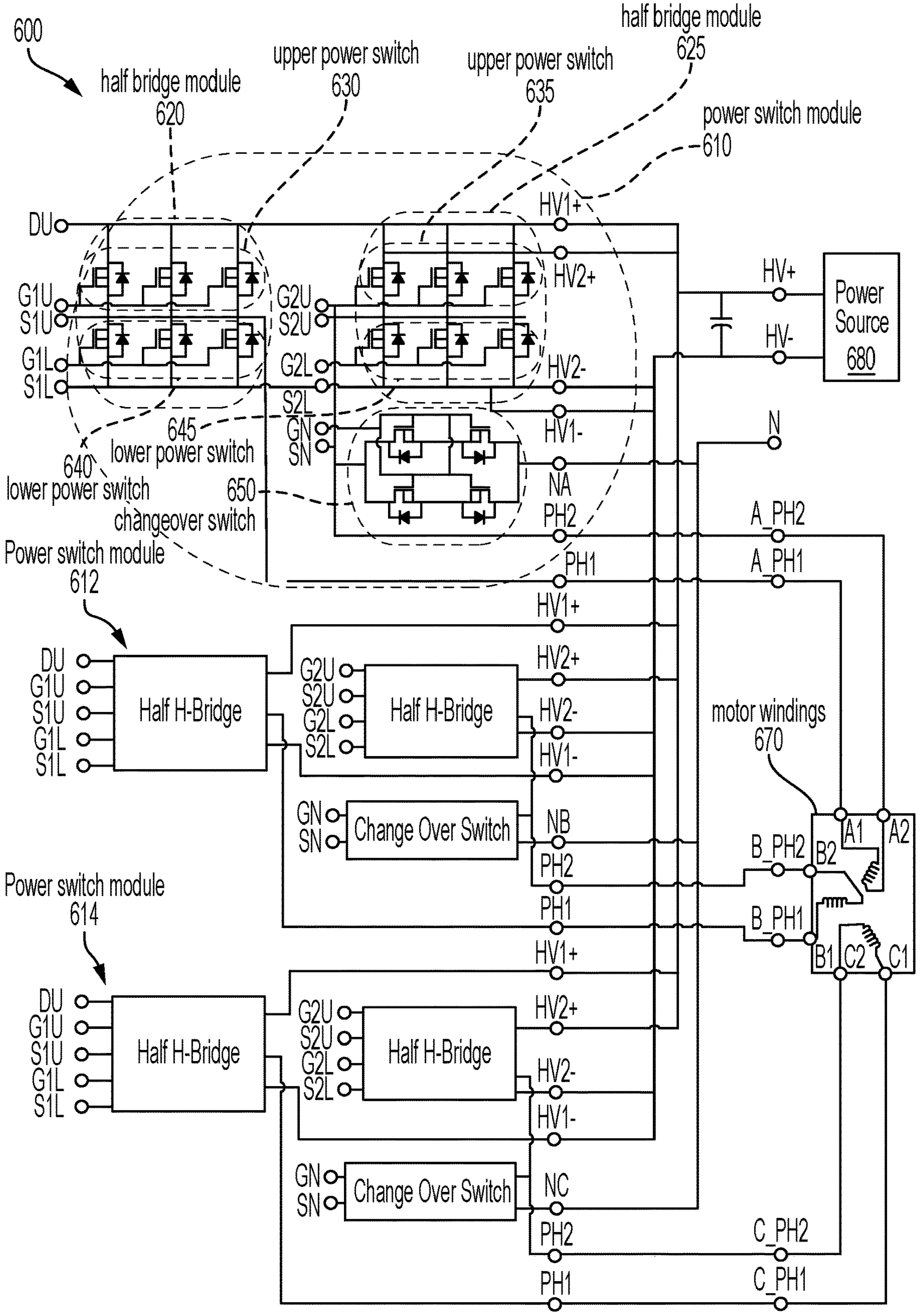
FIG. 6 depicts an exemplary electrical schematic of a switchable inverter circuit configured in a Wye winding configuration, according to one or more embodiments.

FIG. 6 depicts an exemplary electrical schematic of a switchable inverter circuit 600 configured in a Wye winding configuration, according to one or more embodiments. Inverter circuit 600 may include power switch module 610, power switch module 612, power switch module 614, motor windings 670, and power source 680.

Each power switch module 610, 612, and 614 may include two inverters (phase switches) and a changeover switch. Examples of suitable inverters include half bridge inverters, but other inverter types are possible.

For example, power switch module 610 may include half bridge modules 620 and 625. In turn, half bridge module 620 may include upper power switch 630 and lower power switch 640. Similarly, half bridge module 625 may include upper power switch 635 and lower power switch 645.

Power switch module 610 may include changeover switch 650, which may adjust voltages from half bridge modules 620 and/or 625. For instance, in the Wye configuration as depicted, power from only half bridge module 620 may be applied to motor windings 670 and power from half bridge module 625 is not applied to motor windings 670.

Figure 7:
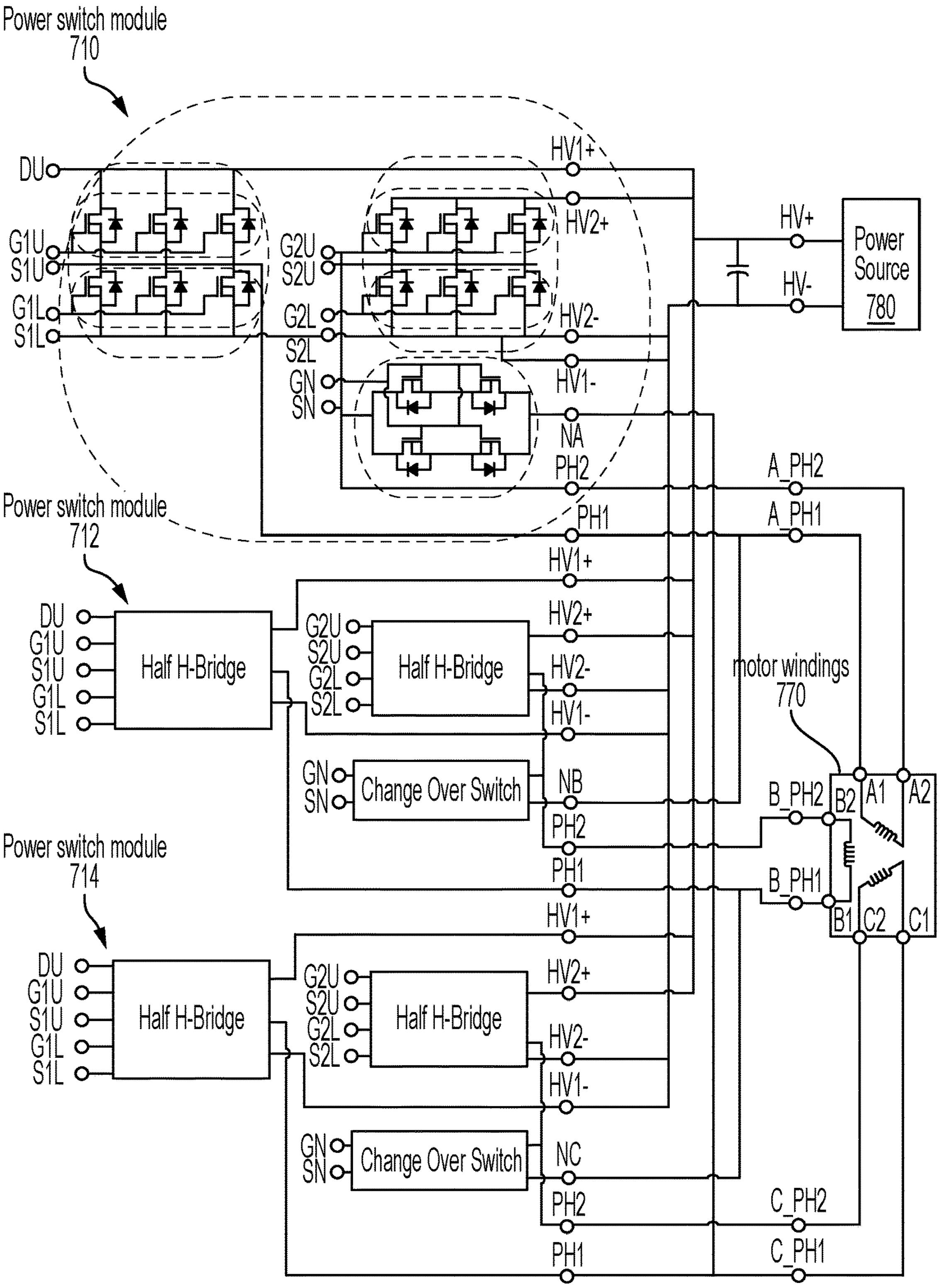
FIG. 7 depicts an exemplary electrical schematic of a switchable inverter circuit configured in a Delta winding configuration, according to one or more embodiments.

As further discussed with respect to FIG. 7, switchable inverter circuit 600 may be reconfigured to use a Delta configuration with both half-bridge modules 620 and 625 active.

FIG. 7 depicts an exemplary electrical schematic of a switchable inverter circuit 700 configured in a Delta winding configuration, according to one or more embodiments. Inverter circuit 700 may include power switch module 710, power switch module 712, power switch module 714, motor windings 770, and power source 780. Relative to FIG. 6, motor windings 770 are configured in a Delta configuration rather than in a Wye configuration (see motor windings 670).

Traditionally, an implementation of a changeover switch may be complex to build and may require additional cooling, for instance, three separate cooling rails, one for each phase. By contrast, one or more embodiments may address these concerns by partitioning the system such that a single phase inverter and single changeover switch are provided in close proximity. For example, a given power switch module (for instance, 610, 612, 614, 710, 712, and 714) may be integrated into a single package that may include two half bridge inverters and a changeover switch in close proximity. This approach may shorten high voltage connections and reduce heat. One such example is discussed with respect to FIG. 8.

Figure 8:
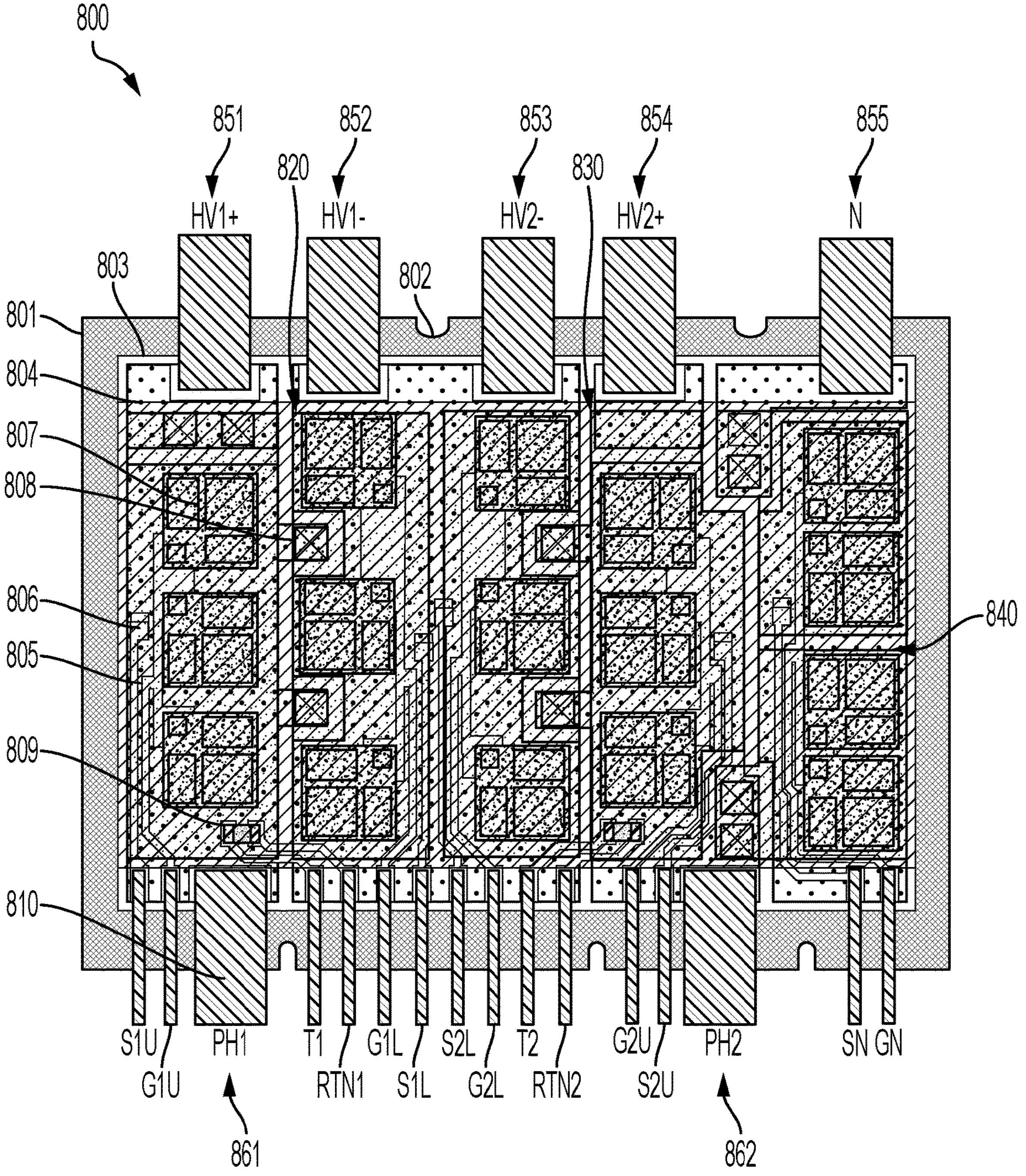
FIG. 8 depicts an exemplary architecture for a power module, according to one or more embodiments.

FIG. 8 depicts an exemplary architecture for a power module 800, according to one or more embodiments. Power module 800 represents an integrated package that may include two inverters (e.g., half-bridge inverters) and a changeover circuits, as discussed with respect to FIGS. 6 and 7. A given power module 800 therefore represents one phase of a multi-phase power delivery system. As discussed further herein, for instance with respect to FIG. 9, multiple power modules may be integrated into a single system in conjunction with a cooling system.

By placing inverters and a changeover switch for a given phase in a single package, certain advantages may be obtained such as lower heat and shorter high voltage paths. To realize these advantages, power module 800 may leverage various technologies such as "flex on substrate" (FoS). A substrate is a non-conductive material that provides mechanical support and electrical insulation for the components and conductive traces. FoS may allow a full use of the source thermal path by using openings in a dielectric to directly make a connection to the lower substrate and may employ thin layers of polyimide routed under a die to make gate connections without interference with source connections. Disclosed power modules may also leverage features overmolded exteriors, as well as various features such as electrically conductive spacers, vias, and surface mounted thermistors.

Power module 800 may further include exterior 801, feature 802, substrates 803 and 804, metal layer 805, vias 806, substrates 807, electrically conductive spacers 808, thermistors 809, tabs 810, inverter 810, inverter 820, and changeover switch 840.

Examples of inverter 820, inverter 830, and changeover switch 840 are discussed in FIGS. 6 and 7. Inverter 820 and inverter 830 may be half-bridge inverters. These Inverters may be used to apply pulse width modulated voltage in controlling the current applied to inductive loads such as motors. As depicted, inverter 820 is positioned towards the left side of the power module 800, inverter 830 to the middle, and changeover switch 840 towards the right of power module 800. But other arrangements are possible.

Power module 800 may be formed of one or more substrates, metal layers, and so forth. In one example, a source and its related circuits may most naturally be on the opposing substrates for the two switches in a half bridge inverter. In a half bridge circuit, a source of an upper switch and a drain of the lower switch may share a common connection with the load, and the source and drain may be on opposite sides of a bare die that are used in power applications. For high voltage, dual side cooled applications, the source and the drain may be cooled at their interconnects, through an insulating substrate, with the drain being on one substrate and the source being on the other. Other layouts are possible.

Exterior 801 may be overmolded and may comprise a dielectric material. Feature 802, shown as a carveout of exterior 801, may serve to increase creepage distance between terminals or tabs. A creepage distance is a shortest distance between two conductive paths measured along the surface of a solid insulation.

Power module 800 may also include one or more metal layers 805 and/or substrates 807. For instance, substrates 803 and 804 may have a thermally conductive interface to both sides of the SiC die. Substrate 803 may be a Si3N4 substrate with AMB copper providing 1st metal layer. Substrate 804, may be a Si3N4 substrate with AMB copper providing $3^{rd}$ metal layer. Metal layer 805 may be embedded within a polyimide flex circuit laminated onto the source substrate providing gate routing. In some cases, metal layer 805 may include multiple conductive regions electrically separated from each other.

Substrate 807 may be positioned to carry a Silicon Carbide (SiC) die. In an example, sources are connected to the underlying plane while the gate interconnect is to the flex circuit on second metal. The drains may be connected to the opposing substrate plane. Interconnect may be done with soldering or sintering. Substrate 807 may have silicon nitride ($Si_3N_4$) middle layers having thick metallization, e.g., direct bond copper (DBC) or active metal brazing (AMB) that may be employed on an outer surface and an inner surface of a ceramic middle layer. The SiC die may have a drain connection to the upper substrate and/or a source connection attached to the lower substrate.

In an example, power module 800 may include a Si3N4 substrate with AMB copper providing a metal layer (e.g., a first metal layer) and/or a Si3N4 substrate with AMB copper providing a metal layer (e.g., a third metal layer), and/or a flex on substrate layer providing a metal layer (e.g., a second metal layer) on the source side. Additional details are discussed further with respect to FIG. 24.

Power module 800 may include one or more features such as vias 806 connecting flex signal trace to an underlying plane. In some cases, a via may connect to or from one or more of the conducting layers.

Electrically conductive spacers 808 may provide substrate-to-substrate interconnects. Spacers may help resolve assembly challenges including heat and current paths. The spacers may be formed of copper, for example, or another electrically and/or thermally conductive material. The spacers may provide a connection between a first substrate and a second substrate, thereby conducting current between substrates.

In an example, a spacer is approximately 2 mm by approximately 2 mm, and may have a thickness similar to that of a die, such as approximately 180 μm, for example. The spacers may be surface mount components and placed along with SiC MOSFETs using a same process. The spacers may replace wires and clips that some systems may use, and die interconnects may allow the gate, drain, and source to be connected to the same substrate.

The spacers may provide for reduced loop inductance in the device. Reduced loop inductance may, in turn, provide less ringing and less voltage overshoot. An application of the device may then speed up the switching time, reduce the power, and may offer more current throughput at a given price and performance point.

The spacers may be compatible with methods used to make connections to both sides of a die, such as by sinter or solder interconnect, for example. The electrically conductive spacers may thus allow current to flow between the two substrates.

In an aspect, power module 800 may include one or more surface-mount components such as, for example, a temperature sensor, thermistor, capacitor, resistor, or another integrated circuit (IC), such as a gate driver, etc. As depicted, thermistors 809 are provided for thermal management. For example, a temperature measurement from thermistors 809 may be provided to controller 300. In turn, controller 300 may take one or more actions such as adjusting current, changing winding configuration, sending an alert, and so forth.

Examples of tabs 810, or connections include various voltage, or power tabs. For example, tabs 810 include positive voltage (HV1+) 851, negative voltage (HV1−) 852, negative voltage (HV2−) 853, positive voltage (HV2+) 854, neutral (N) 855, phase 1 output (PH1) 861, and phase 2 output (PH2) 862. In an example, DC power is provided to positive voltage (HV1+) 851, negative voltage (HV1−) 852, negative voltage (HV2−) 853, and positive voltage (HV2+) 854. In turn, the inverter 820 and inverter 830 output AC power to phase 1 output (PH1) 861, and phase 2 output (PH2) 862 respectively. Tabs 810 may be formed of any conductive material such as copper.

Power module 800 may include a lead frame that provides interconnect to the rest of the inverter. The lead frame may provide improvements relative to existing technologies.

As discussed further herein, various cooling systems, active and/or passive may be used. For example, a cooling system may include an active cooling system, e.g., an active heat sink, and a passive cooling system, e.g., a passive heat sink having a thermo-conductive cooling structure. The thermo-conductive cooling structure may include a plate of thermally conductive materials, as described in more detail below. The passive heat sink (e.g., thermo-conductive cooling structure) may contact both the active heat sink and a power switch. The passive heat sink (e.g., thermo-conductive cooling structure) may be configured to dissipate heat away from the power switch and toward the active heat sink.

Additional examples of power modules are discussed further with respect to FIGS. 11, 12, 18, and 19. Other examples are possible.

Figure 9:
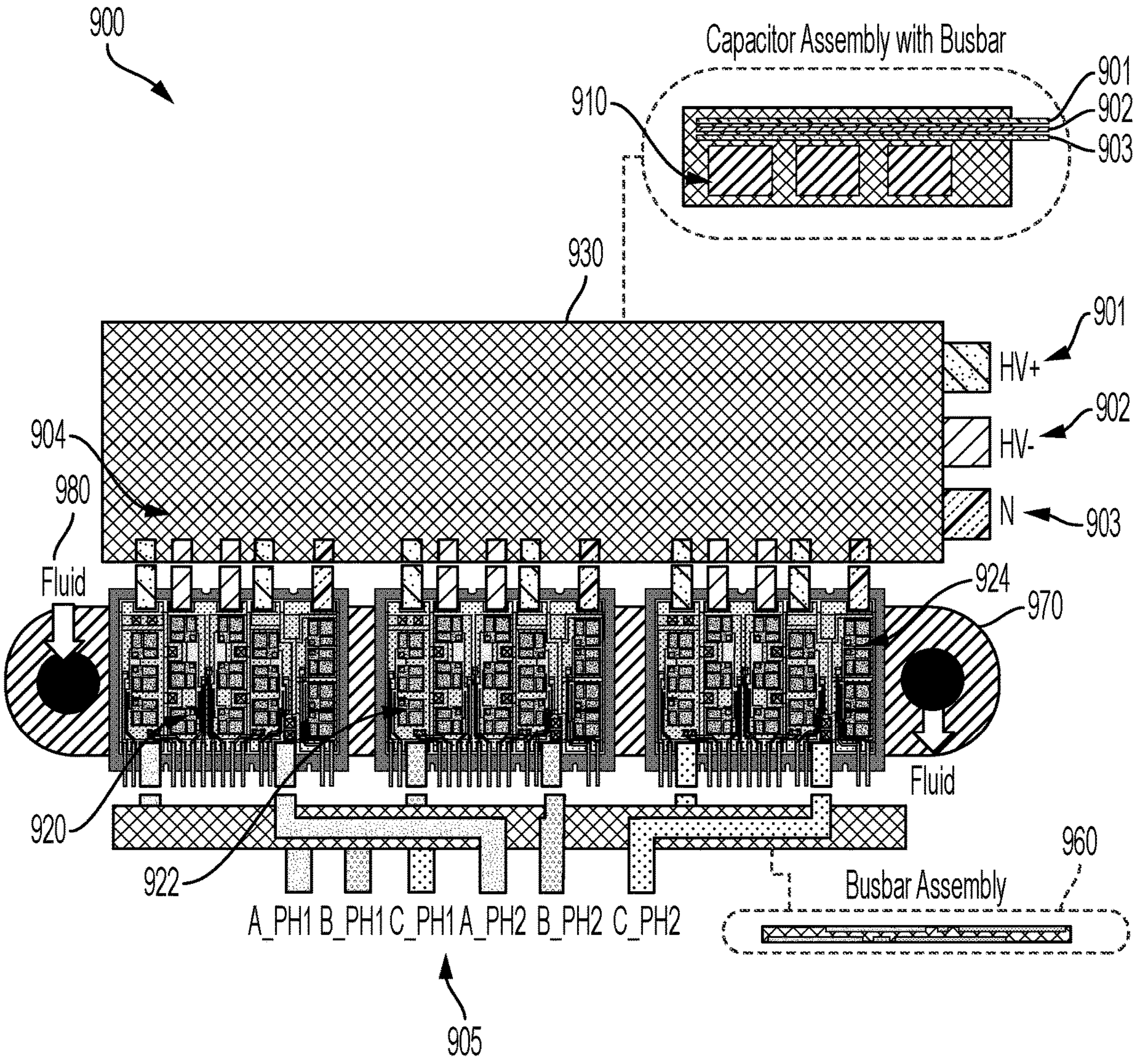
FIG. 9 depicts an exemplary layout for a three-phase inverter package, according to one or more embodiments.

FIG. 9 depicts an exemplary three-phase inverter package 900, according to one or more embodiments. Package 900 includes a case 930 which facilitates connections with power modules 920, 922, and 924, which in turn are actively cooled by cooling rail 970. An example of power modules 920, 922, and 924 is power module 800 depicted in FIG. 8. Power modules may also be referred to as switch assemblies.

Case 930 facilitates connection of the positive rail, negative rail, and neutral rail to each of power module 920, 922, and 924. DC power is applied to the positive and negative rail, flows across busbars and into the terminals of the power module package 900. Power exits the power module across the busbar assembly 960 via the phase terminals 905 to the electrical load (e.g., motor).

Case 930 may include positive voltage input 901, negative voltage input 902, and neutral output 903. These connections are passed across one or more plates on case 930. The plates connect to the power modules via various terminals 904. For example, a first plate may conduct power from positive voltage input 901 to the power modules. A second plate may conduct power from negative voltage input 902 to the power modules. A third plate may conduct power from the power modules to neutral output 903.

In turn, each of power modules 920, 922, and 924 converts DC to AC power and outputs AC power via one or more phase terminals 905. Phase terminals 905 are assembled onto busbar assembly 960.

The neutral output 903 is a generated output by the inverters. Access to the neutral rail may provide advantages in the case of a failure event. The power modules 920, 922, and 924 may be cooled via an active and/or passive cooling system. For example, fluid 980 may enter cooling rail 970, cool the power modules, and be returned. Cooling rail 970 may include two halves (not depicted).

Case 930 may include one or more capacitors 910 (e.g., six capacitors). Each capacitor (or capacitor pair, for example) may correspond to one of power modules 920, 922, and 924.

Figure 10:
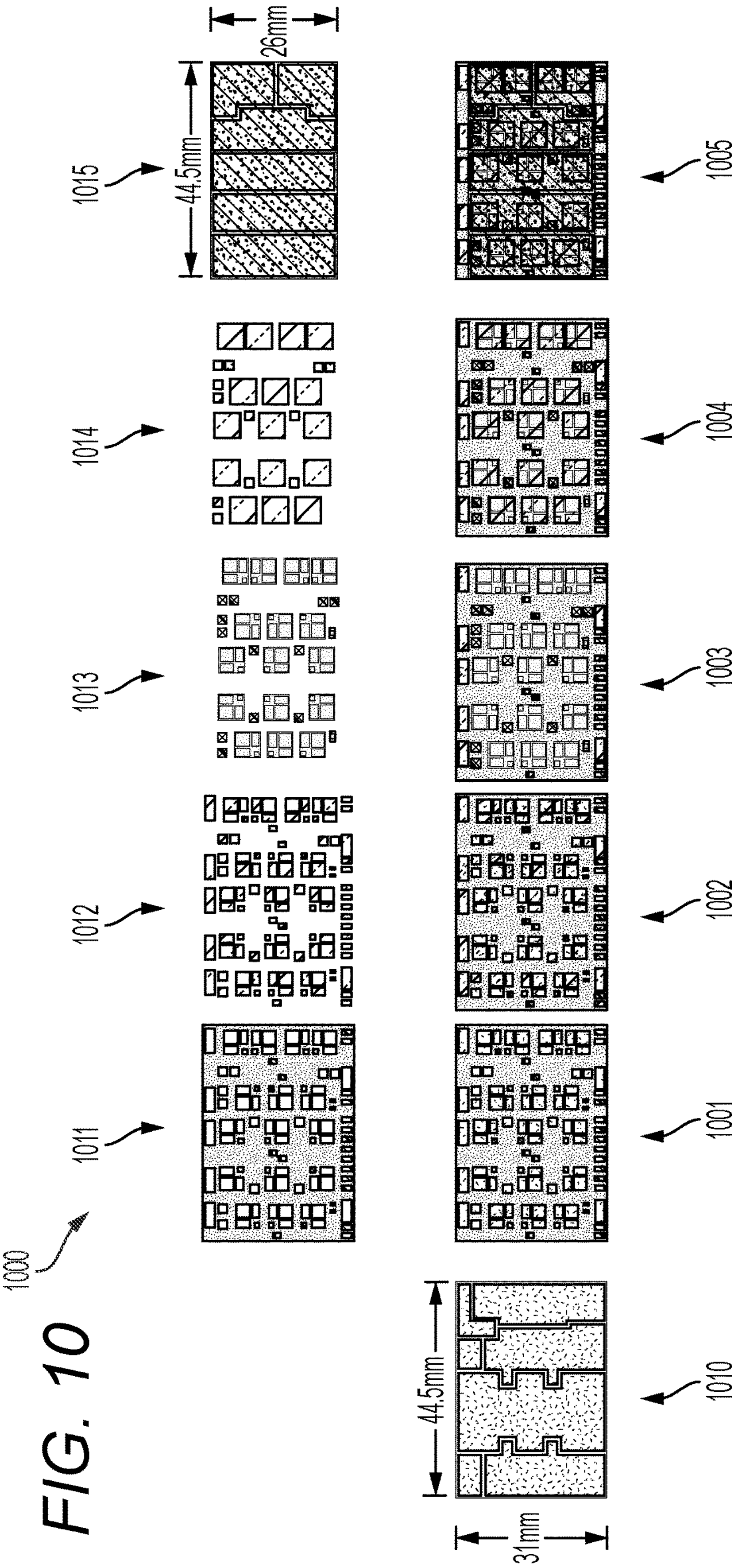
FIG. 10 depicts an exemplary physical construction of a power module, according to one or more embodiments.

FIG. 10 depicts an exemplary physical construction 1000 of a power module, according to one or more embodiments. FIG. 10 depicts assembly of a power module including use of a substrate. Physical construction 1000 may include stages 1001, 1002, 1003, 1004, and 1005, but other stages are possible.

Each stage 1000-1005 represents the addition of one or more components to the assembly. Physical construction 1000 may further include substrate 1010, flex material 1011 (which may include a second metal layer), solder preforms 1012, various components 1013, additional solder preforms 1014, and drain substrate 1015. Examples of substrate include Si3N4 AMB SBST.

At stage 1001, substrate 1010 is integrated with flex material 1011. At stage 1002, the integration created at stage 1001, e.g., substrate 1010 and flex material 1011, is integrated with solder preforms 1012. At stage 1003, the integration created at stage 1002 is integrated with components 1013. At stage 1004, the integration created at stage 1003 is integrated with solder preforms 1014. At stage 1005, the integration created at stage 1004 is integrated with drain substrate 1015. In some cases, the substrate 1010 and drain substrate 1015 may be individually assembled, and then integrated to form a power module.

The assembly may include laminating polyimide film onto the source substrate. The polyimide, carrying the second metal, may replace a solder mask on the source substrate. The assembly may include using placed informs rather than a solder print operation, and may provide a consistency in height necessary to reduce a variation in thickness. Placed informs may also allow introduction of a higher temperature solder. The power module may provide a significant increase in current capability relative to some systems.

Figure 11:
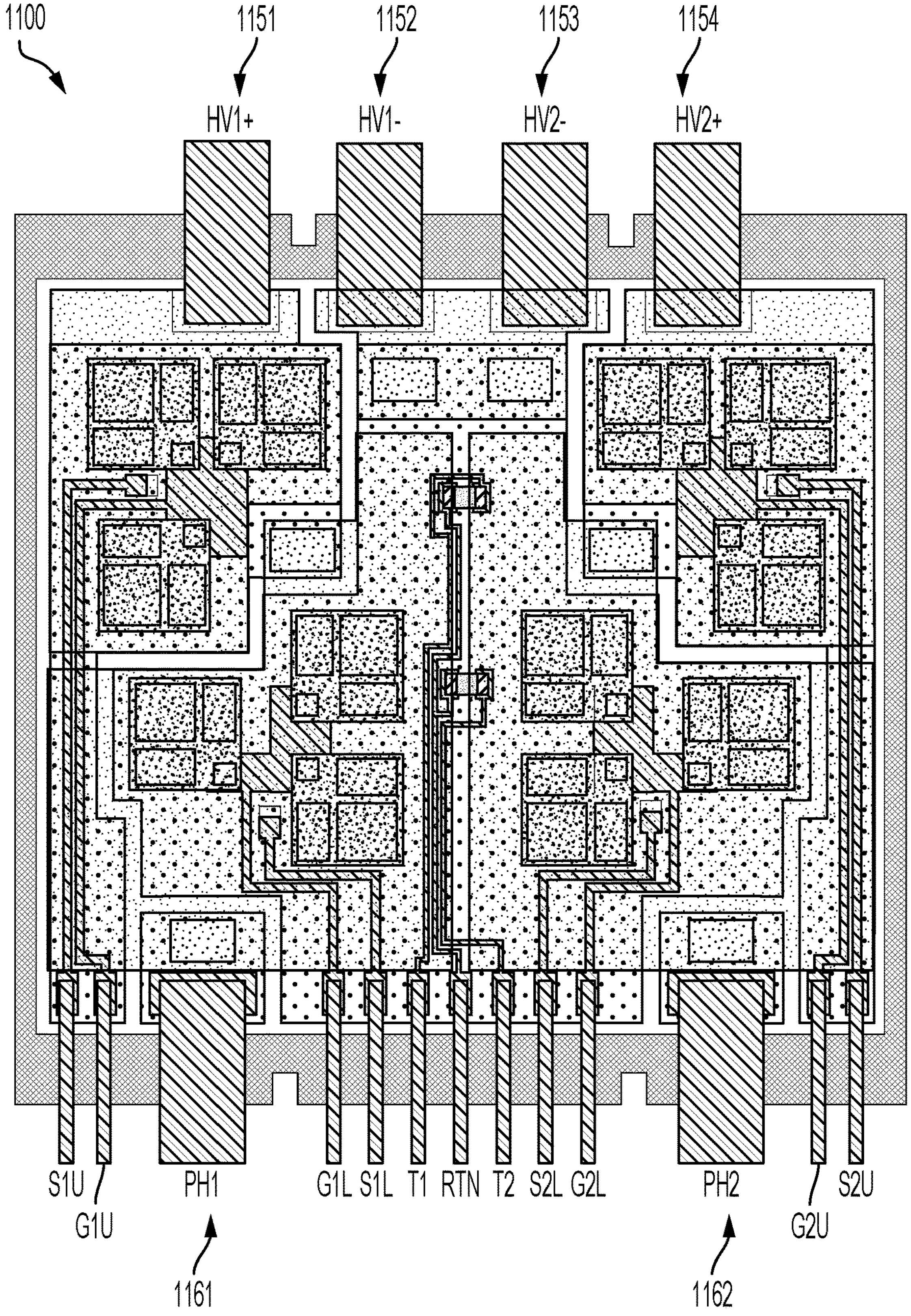
FIG. 11 depicts an exemplary architecture for a power module, according to one or more embodiments.

FIG. 11 depicts an exemplary architecture for a power module 1100, according to one or more embodiments. Power module 1100 may include one or more inverters and/or changeover switches. Relative to power module 800 as depicted in FIG. 8, power module 1100 does not include a neutral tab As depicted, power module 1100 may include various connections or tabs, such as positive voltage (HV1+) 1151, negative voltage (HV1−) 1152, negative voltage (HV2−) 1153, positive voltage (HV2+) 1154, phase 1 output (PH1) 1161, and phase 2 output (PH2) 1162.

Figure 12:
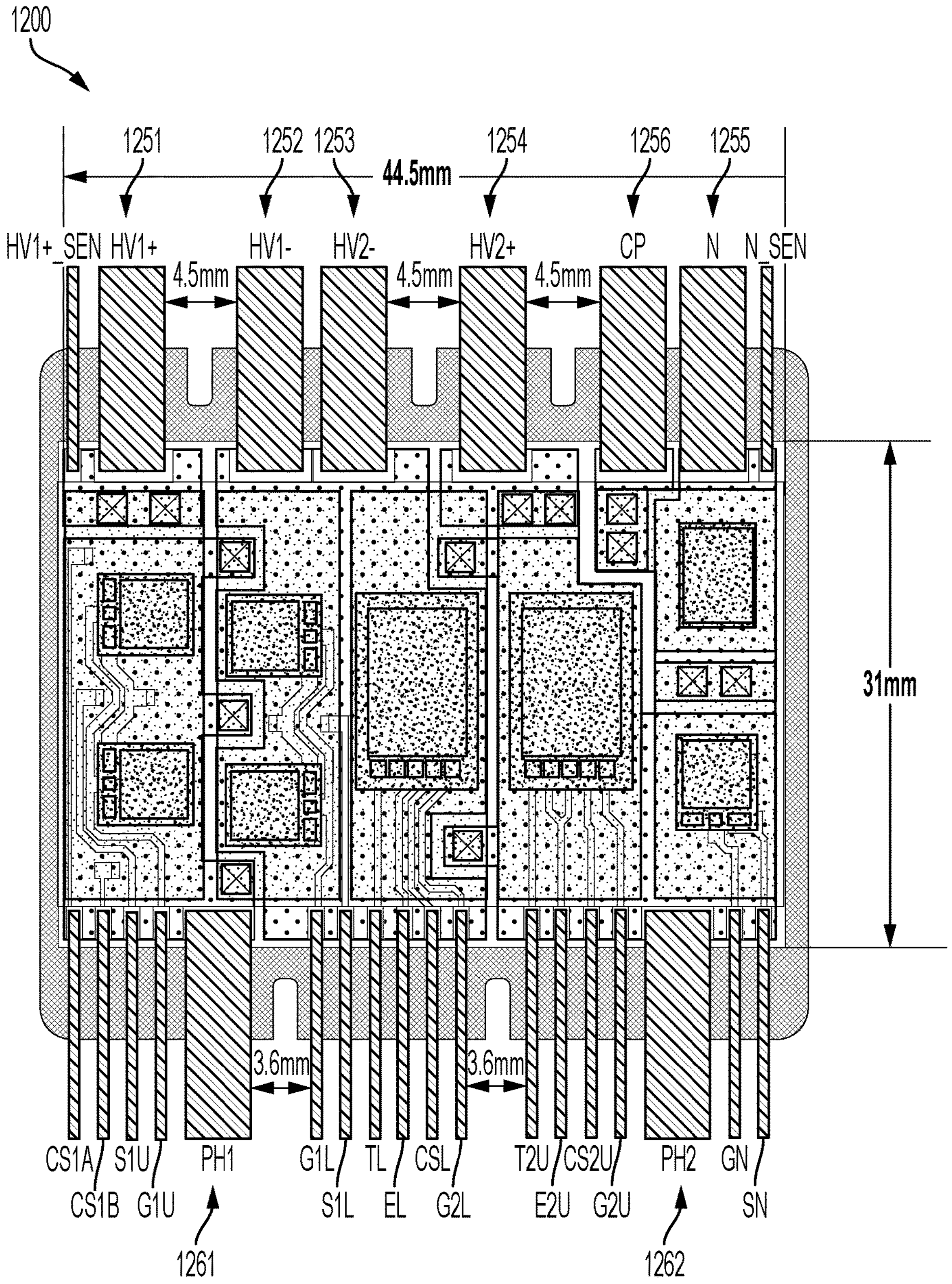
FIG. 12 depicts an exemplary architecture for a power module, according to one or more embodiments.

FIG. 12 depicts an exemplary architecture for a power module 1200, according to one or more embodiments. Power module 1200 may include one or more inverters and/or changeover switches. Relative to power module 800 as depicted in FIG. 8, power module does not include a neutral tab and includes a CP tab.

As depicted, power module 1200 may include various connections or tabs, such as positive voltage (HV1+) 1251, negative voltage (HV1−) 1252, negative voltage (HV2−) 1253, positive voltage (HV2+) 1254, neutral tab 1255, CP (for example, control pilot or control power) tab 1256, phase 1 output (PH1) 1261, and phase 2 output (PH2) 1262.

As depicted, power module 1200 has a distance of 44.5 mm by 31 mm. As depicted, the distance between tabs 1251 and 1252 is 4.5 mm, as is the distance between tabs 1253 and 1254, as is the distance between tabs 1254 and 1256. The distance between tab 1261 and an adjacent control pin is 3.6 mm. Other distances are possible.

Figure 13:
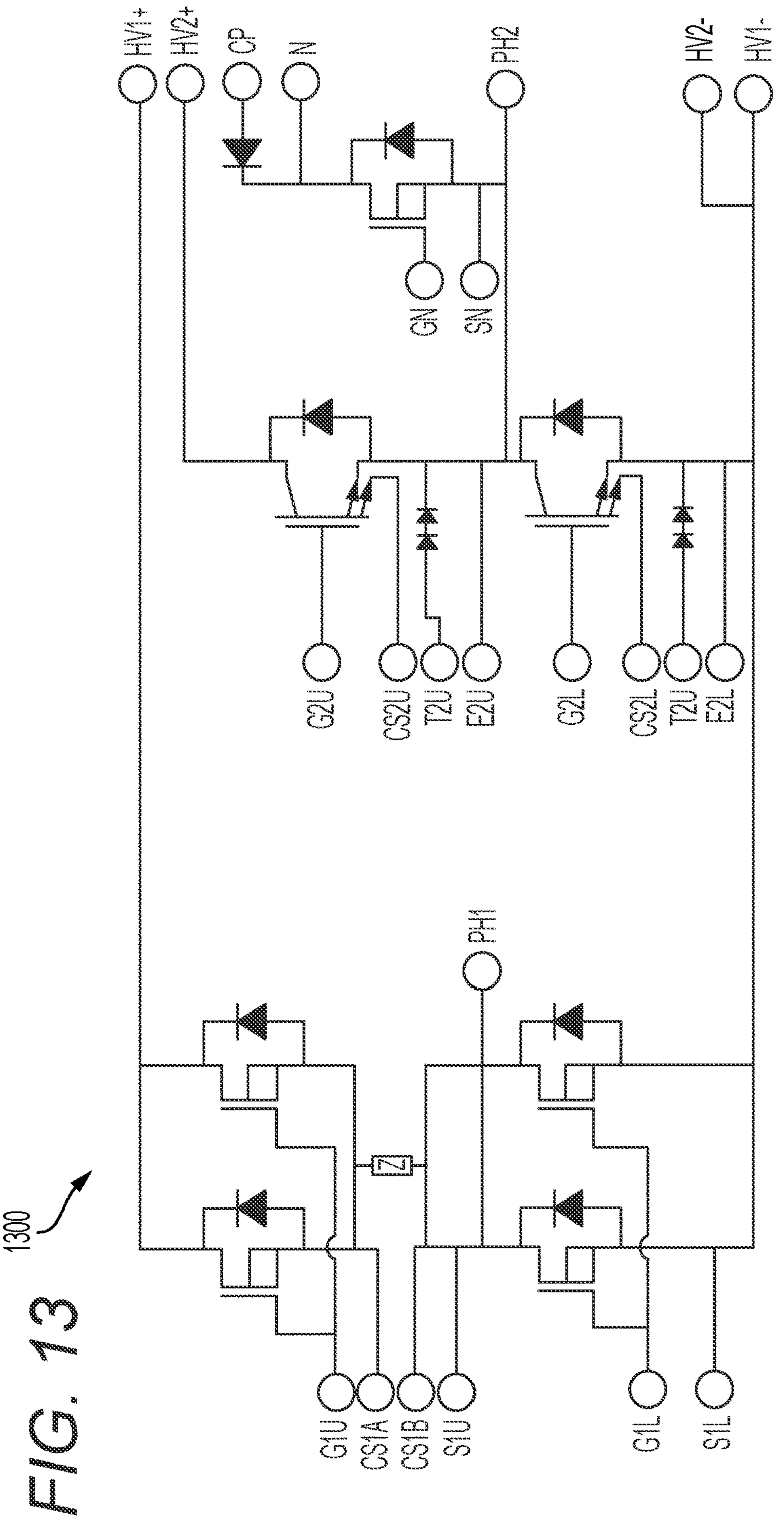
FIG. 13 depicts an electrical schematic of an electrical inverter, according to one or more embodiments.

FIG. 13 depicts an electrical schematic of an electrical inverter 1300, according to one or more embodiments. Electrical inverter 1300 is a two-phase inverter, having HV1+, HV1−, HV2+, and HV2− inputs; and PH1 and PH2 outputs.

Figure 14:
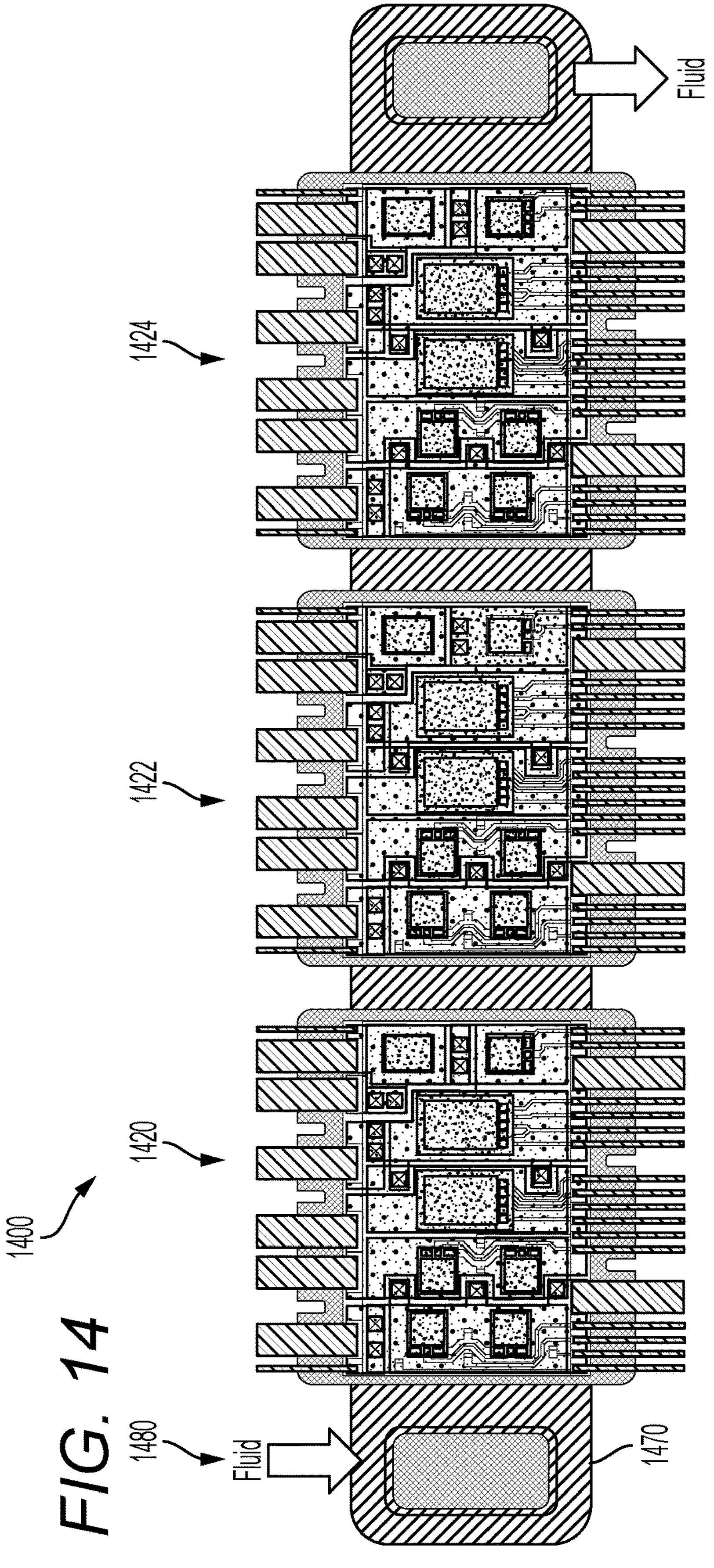
FIG. 14 depicts an exemplary layout for a three-phase inverter package, according to one or more embodiments.

FIG. 14 depicts an exemplary layout for a three-phase inverter package 1400, according to one or more embodiments. Inverter package 1400 may include power modules 1420, 1422, and 1424 positioned over a cooling rail 1470, cooled by fluid 1480. Examples of power modules 1420, 1422, and 1424 include, but are not limited to those depicted in FIGS. 8, 11, and 12.

Figure 15:
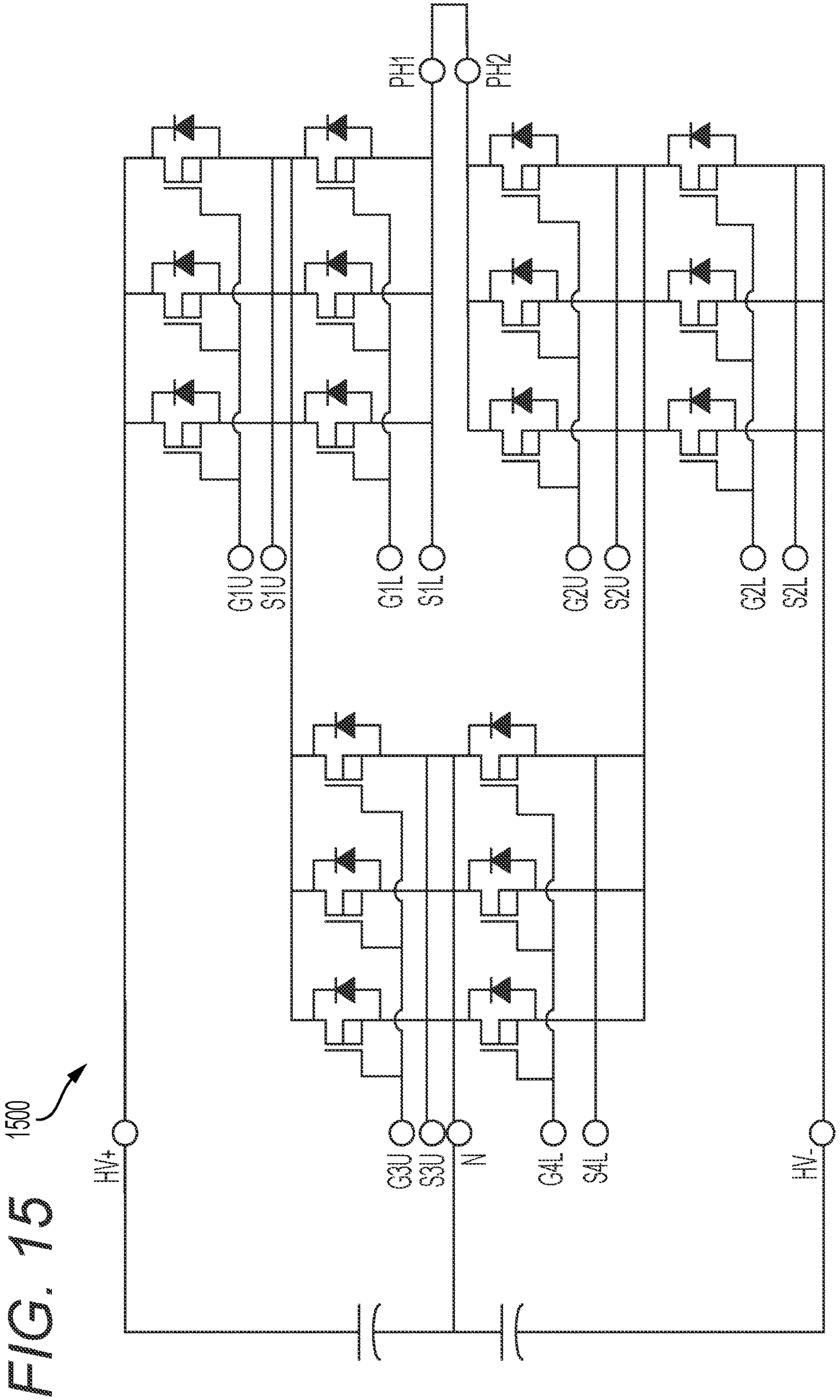
FIG. 15 depicts an electrical schematic of an electrical inverter, according to one or more embodiments.

FIG. 15 depicts an electrical schematic of an electrical inverter 1500, according to one or more embodiments. Electrical inverter 1500 is an Active Neutral Point Clamping (ANPC) three level inverter. Electrical inverter 1500 may be integrated and packaged into the electrical packages discussed herein, for instance in power module 1800 discussed with respect to FIG. 18.

Figure 16:
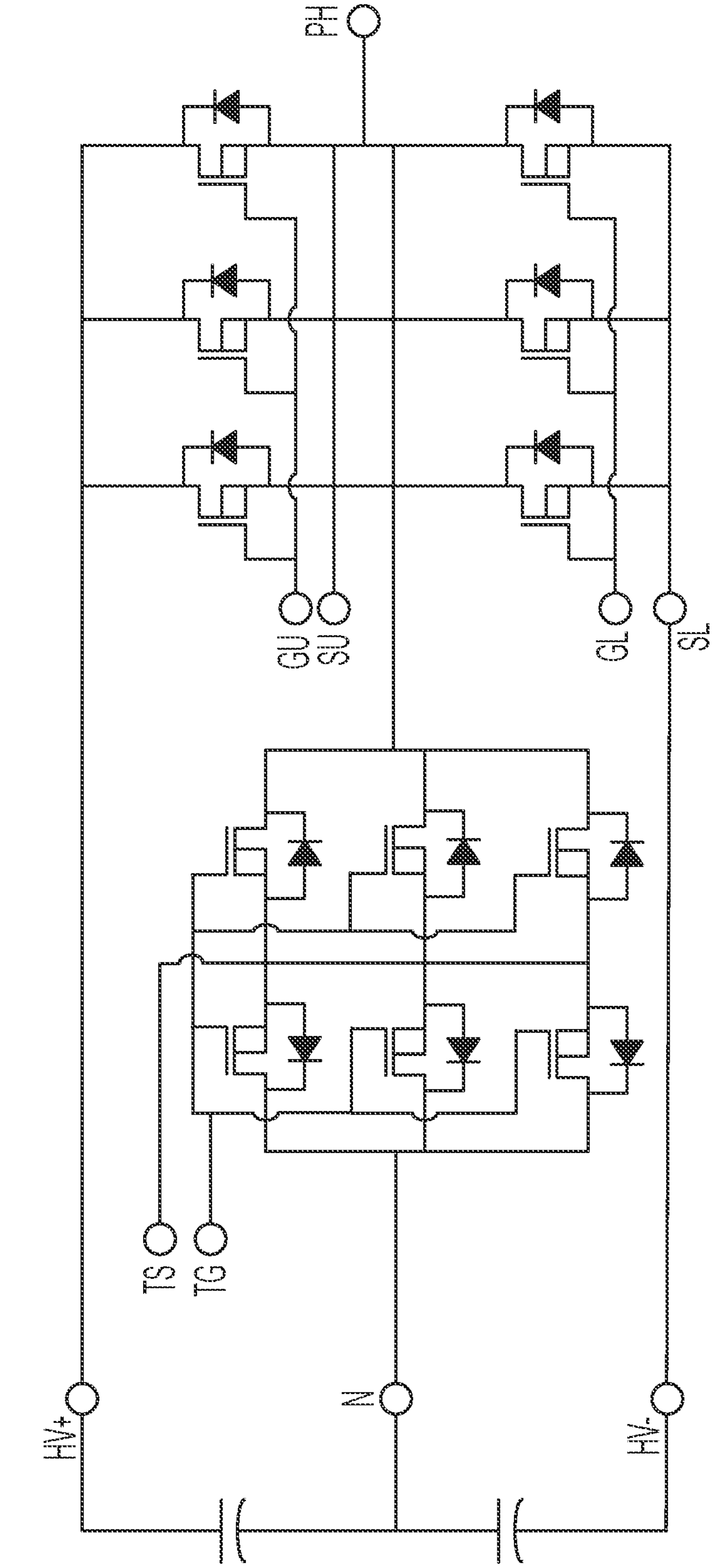
FIG. 16 depicts an electrical schematic of an electrical inverter, according to one or more embodiments.

FIG. 16 depicts an electrical schematic of an electrical inverter 1600, according to one or more embodiments. Electrical inverter 1600 is a T-type three-level inverter. Electrical inverter 1600 may be integrated and packaged into the electrical packages discussed herein, for instance in power module 1800 discussed with respect to FIG. 19.

Figure 17:
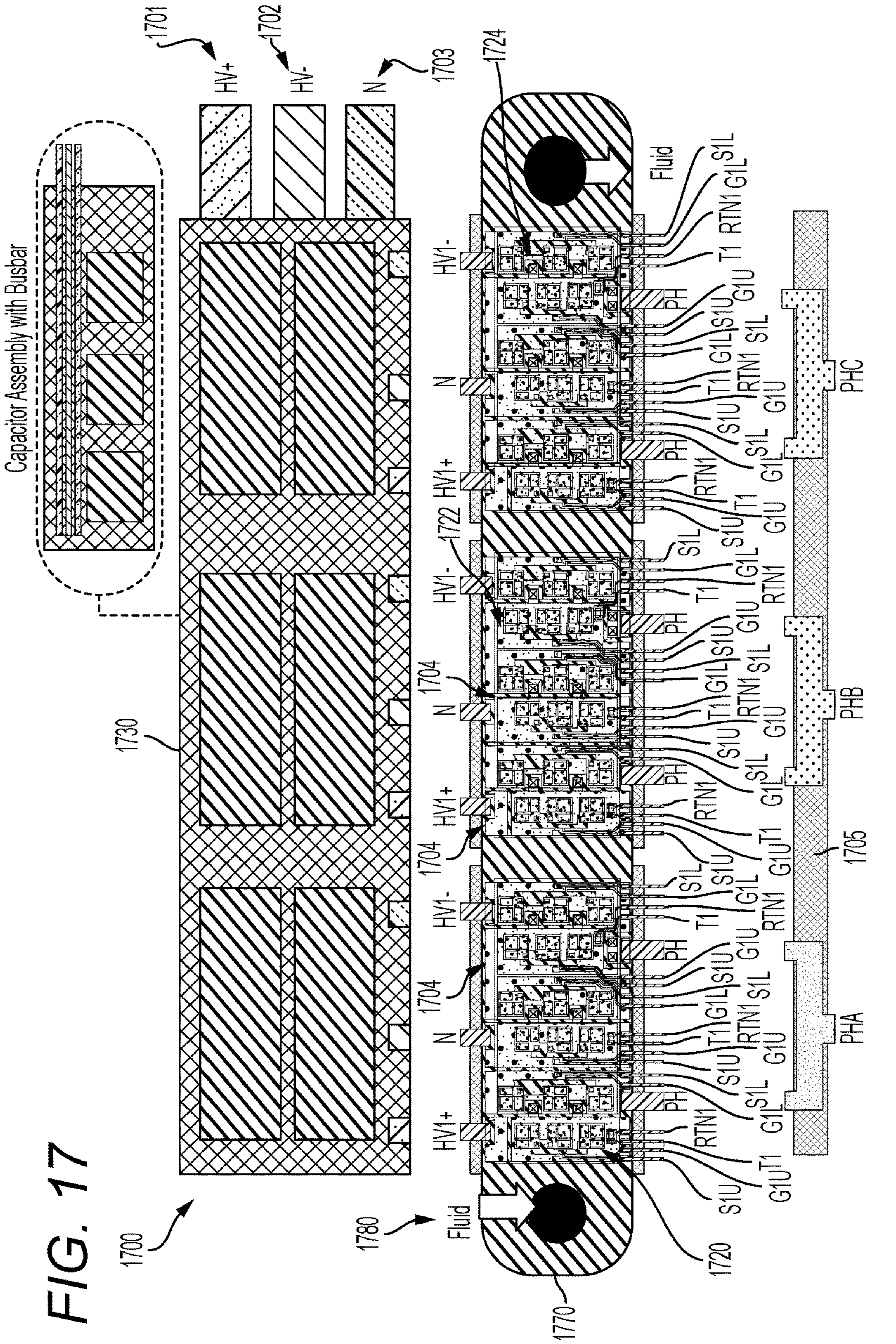
FIG. 17 depicts an exemplary three-phase inverter package of an inverter circuit, according to one or more embodiments.

FIG. 17 depicts an exemplary three-phase inverter package 1700 of an inverter circuit, according to one or more embodiments. Package 1700 may include power modules 1720, 1722, and 1724, which are APNC inverters.

Inverter package 1700 may include power modules 1720, 1722, and 1724 positioned over a cooling rail 1770, cooled by fluid 1780. Examples of power modules 1720, 1722, and 1724 include, but are not limited to those depicted in FIGS. 8, 11, and 12.

Case 1730 may include a positive voltage input, a negative voltage input, and/or a neutral output. These connections are passed across one or more plates on case 1730. The plates connect to the power modules via various terminals 1704. For example, a first plate may conduct power from the positive voltage input to the power modules. A second plate may conduct power from negative the voltage input to the power modules. A third plate may conduct power from the power modules to the neutral output.

In turn, each of power modules 1720, 1722, and 1724 converts DC to AC power and outputs AC power via one or more phase terminals 1705. Phase terminals 1705 are assembled onto busbar assembly 1760. Case 1730 may include one or more capacitors. Each capacitor may correspond to one of power modules 1720, 1722, and 1724.

Figure 18:
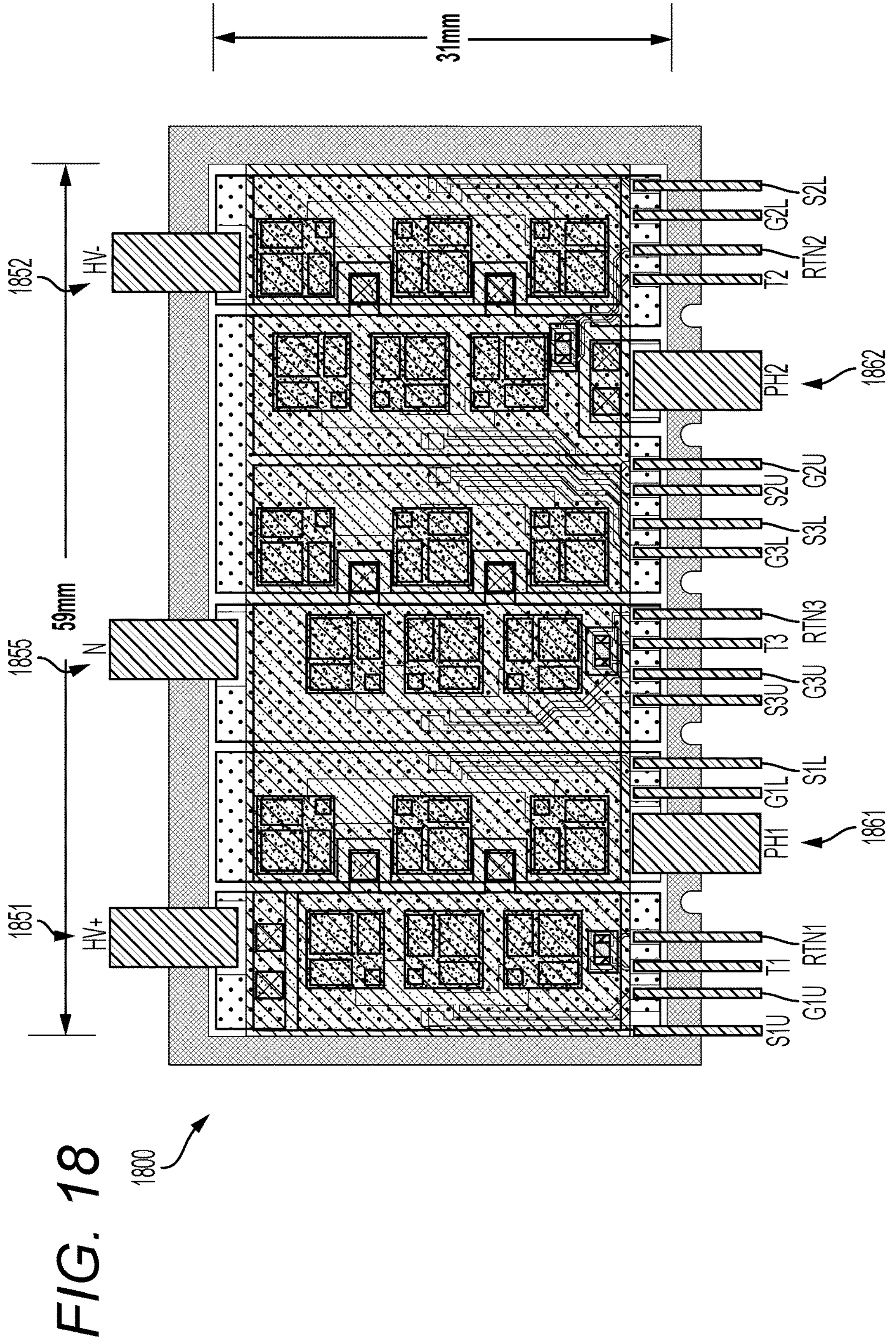
FIG. 18 depicts an exemplary architecture for a power module, according to one or more embodiments.

FIG. 18 depicts an exemplary architecture for a power module 1800, according to one or more embodiments. Power module 1800 is an APNC inverter. Power module

1800 may include various connections or tabs, such as positive voltage (HV+) 1851, negative voltage (HV−) 1852, neutral (N) 1855, phase 1 output (PH1) 1861, and phase 2 output (PH2) 1862.

As can be seen, power module 1800 has dimensions 59 mm×31 mm, but other dimensions are possible.

Figure 19:
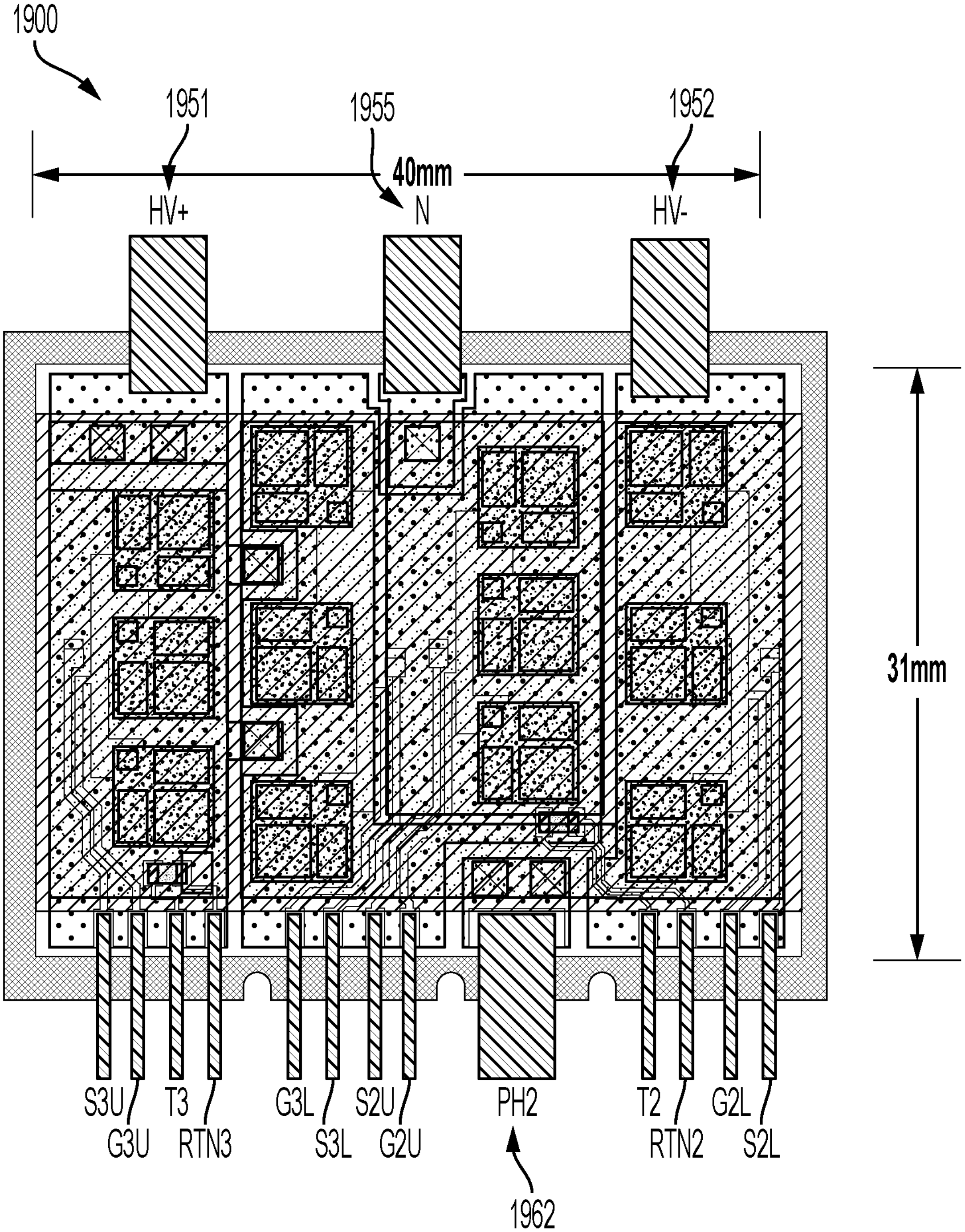
FIG. 19 depicts an exemplary architecture for a power module, according to one or more embodiments.

FIG. 19 depicts an exemplary architecture for a power module, according to one or more embodiments. Power module 1900 is a T-type inverter.

Power module 1900 may include various connections or tabs, such as positive voltage (HV+) 1951, negative voltage (HV−) 1952, neutral (N) 1955, and phase 2 output (PH2) 1962. As depicted, power module 1900 has dimensions 40 mm×31 mm, but other dimensions are possible.

Figure 20:
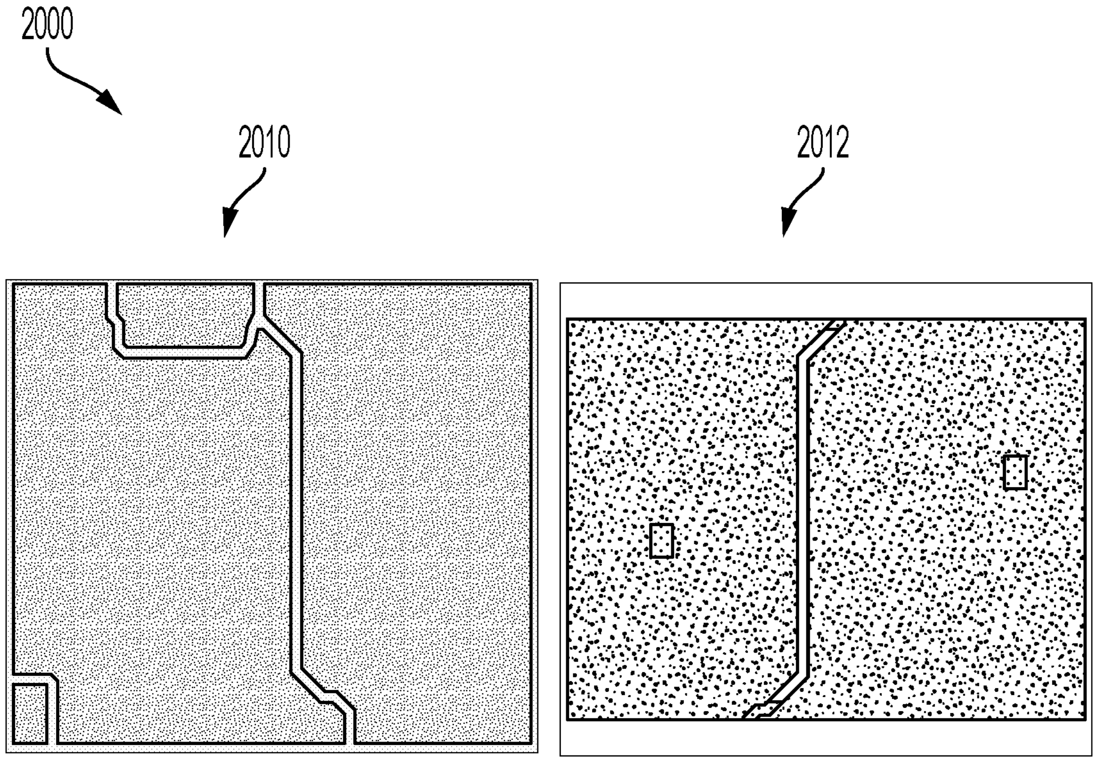
FIG. 20 depicts an assembly of a power module with devices on a single substrate, according to one or more embodiments.

FIG. 20 depicts an assembly 2000 of a power module with devices on a single substrate, according to one or more embodiments. Assembly 2000 may include top substrate 2010 and bottom substrate 2012.

In some devices, having components placed on both a top and a bottom of a substrate, during assembly, the two substrates must be joined, face-to-face, such that necessary electrical connections between the components on the top substrate and bottom substrate are made. For example, connections between gates may be only 1 millimeter by 1 millimeter, requiring precise alignment of the top substrate and bottom substrate. Improper registration during assembly may lead to production loss and higher costs. Therefore, the power module assembled via assembly 2000 may provide all components placed on a single (e.g., exactly one, only one, or no more than one) substrate, such as top substrate 2010, for example, thus avoiding issues of improper registration during assembly when the top substrate 2010 is joined with bottom substrate 2012.

Figure 21:
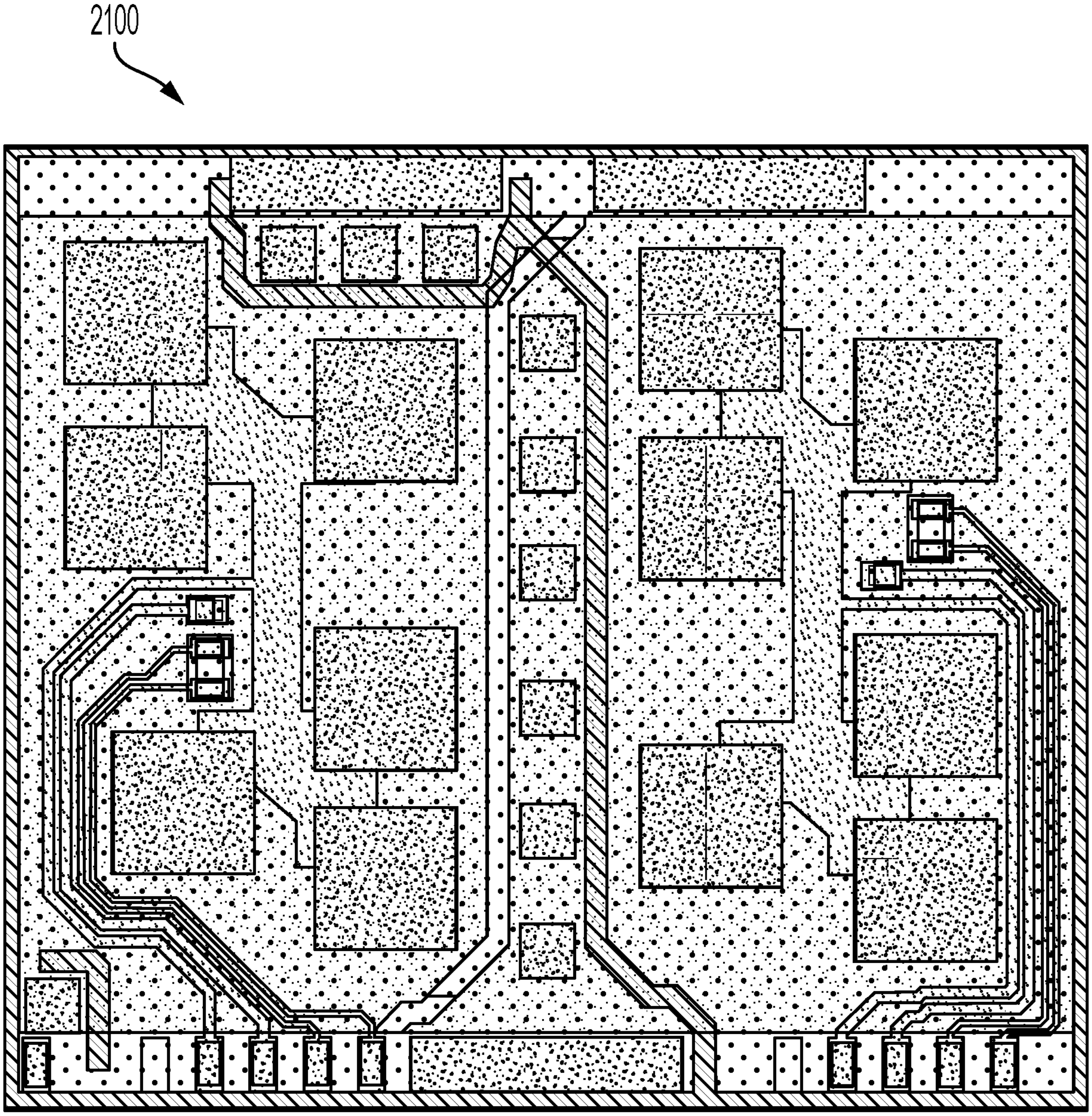
FIG. 21 depicts an assembly of a power module with devices on a single substrate, according to one or more embodiments.

FIG. 21 depicts an assembly 2100 of a power module with devices on a single substrate, according to one or more embodiments. Assembly 2100 is a resulting assembly of the two layers depicted in FIG. 20.

Figure 22:
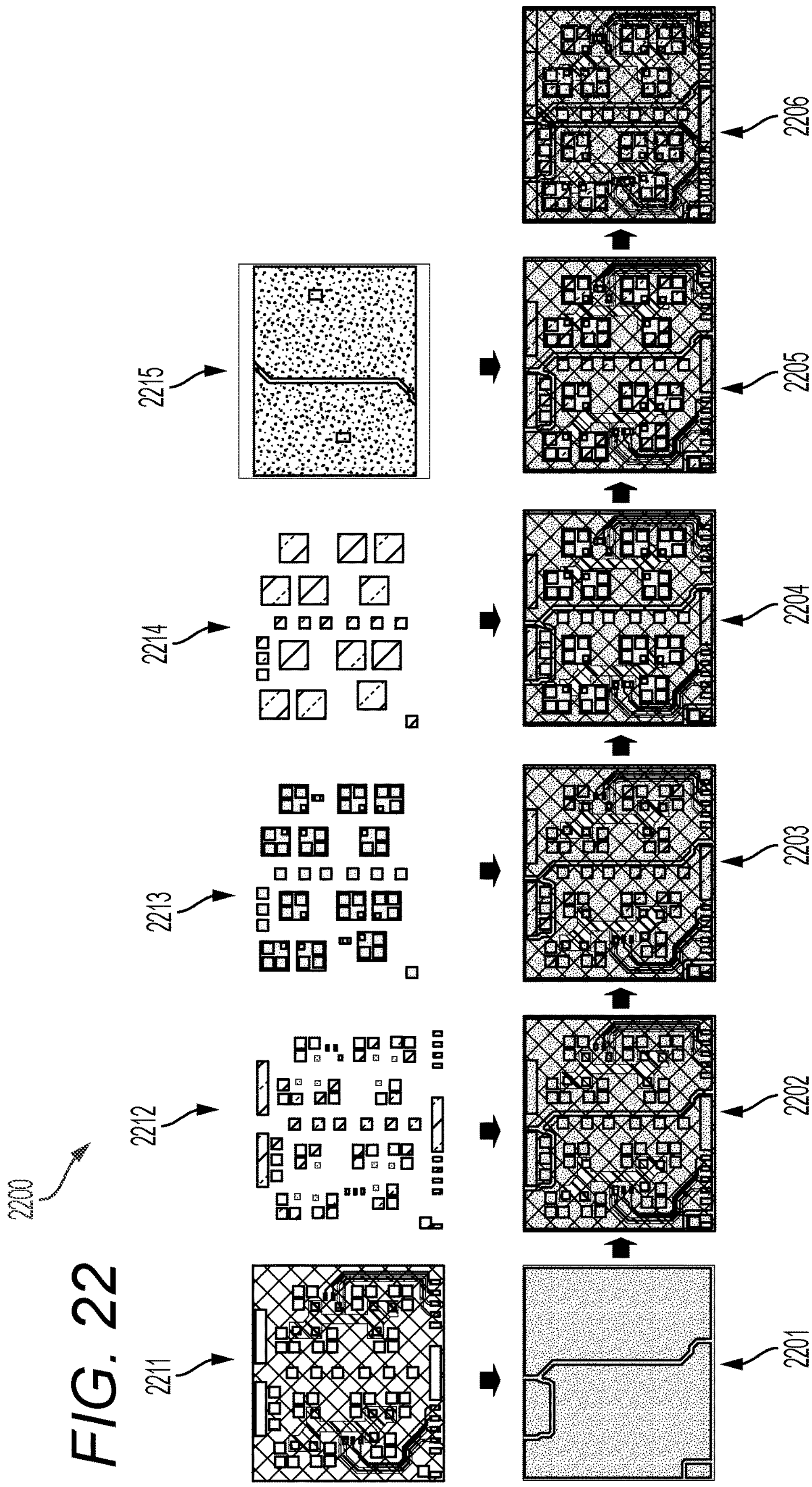
FIG. 22 depicts an assembly of a power module with devices on a single substrate, according to one or more embodiments.

FIG. 22 depicts an assembly of a power module with devices on a single substrate, according to one or more embodiments. Physical construction 2200 may include stages 2201, 2202, 2203, 2204, 2205, and 2206, but other stages are possible. Each stage represents the addition of one or more components to the assembly.

Physical construction 2200 may further include source substrate 2211, source-side solder connections 2212, various components 2213, drain side solder connections 2214, and drain substrate 2215. Examples of components 2213 include, but are not limited to spacers, die, and thermistors. In an example, 10 spacers, 12 dies, and 2 thermistors are included.

At stage 2201, source substrate 2211 is integrated with two layers of polymide with embedded metal. At stage 2202, the integration created at stage 2201, e.g., substrate 2211 and polymide, is integrated with solder connections 2212. At stage 2203, the integration created at stage 2202 is integrated with components 2213. At stage 2204, the integration created at stage 2203 is integrated with the drain side solder connection 2214. At stage 2205, the integration created at stage 2204 is integrated with the drain substrate 2215, creating the final package.

Figure 23:
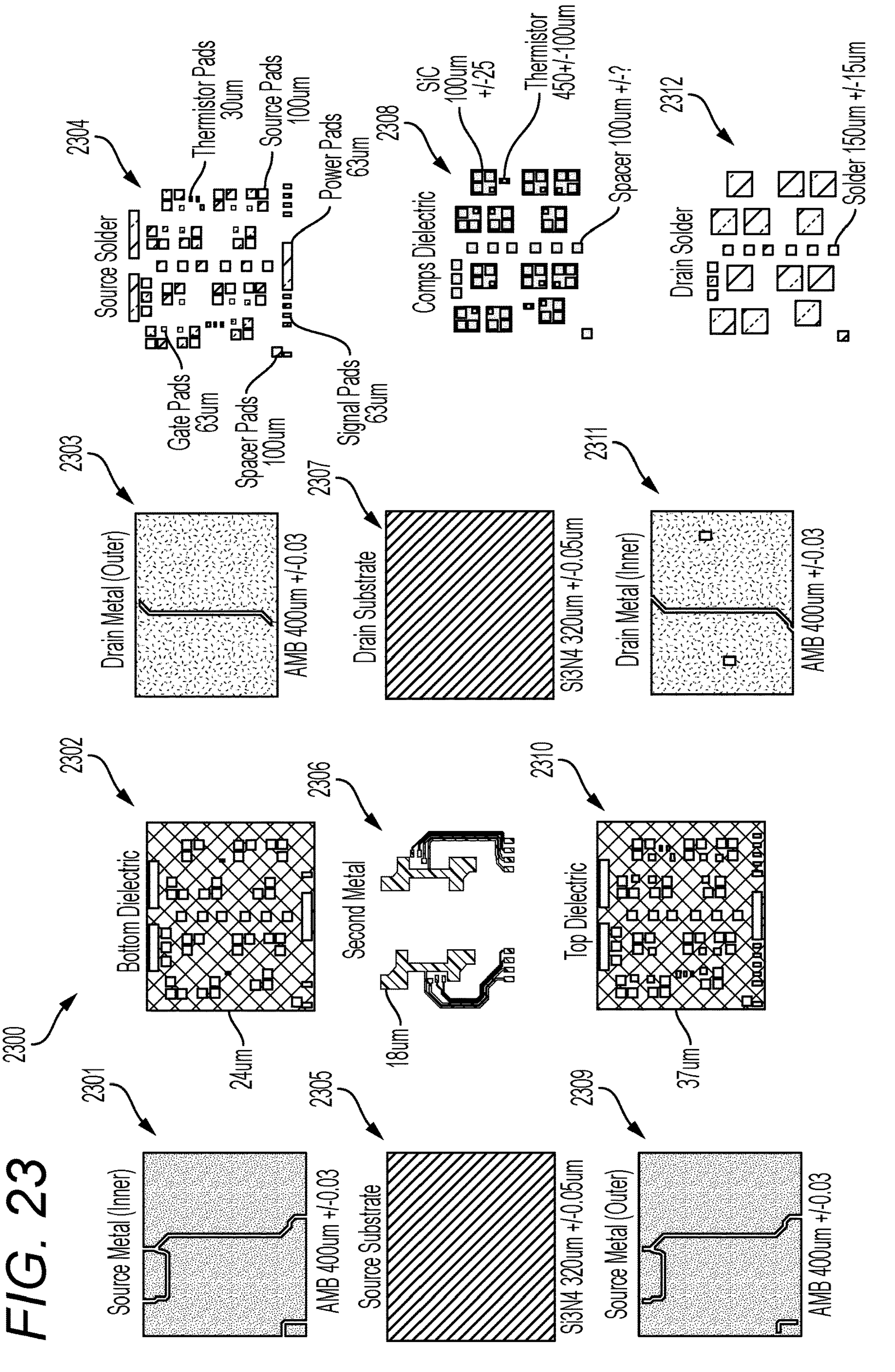
FIG. 23 depicts an assembly of a power module with devices on a source substrate and a drain substrate, according to one or more embodiments.

FIG. 23 depicts an assembly 2300 of a power module with devices on a source substrate and a drain substrate, according to one or more embodiments.

Assembly 2300 may include source metal layer (inner) 2301, bottom dielectric 2302, drain metal 2303, source solder 2304, source substrate 2305, second metal 2306, drain substrate 2307, dielectric 2308, source metal (outer) 2309, top dielectric 2310, drain metal (inner) 2311, and drain solder 2312.

Figure 24:
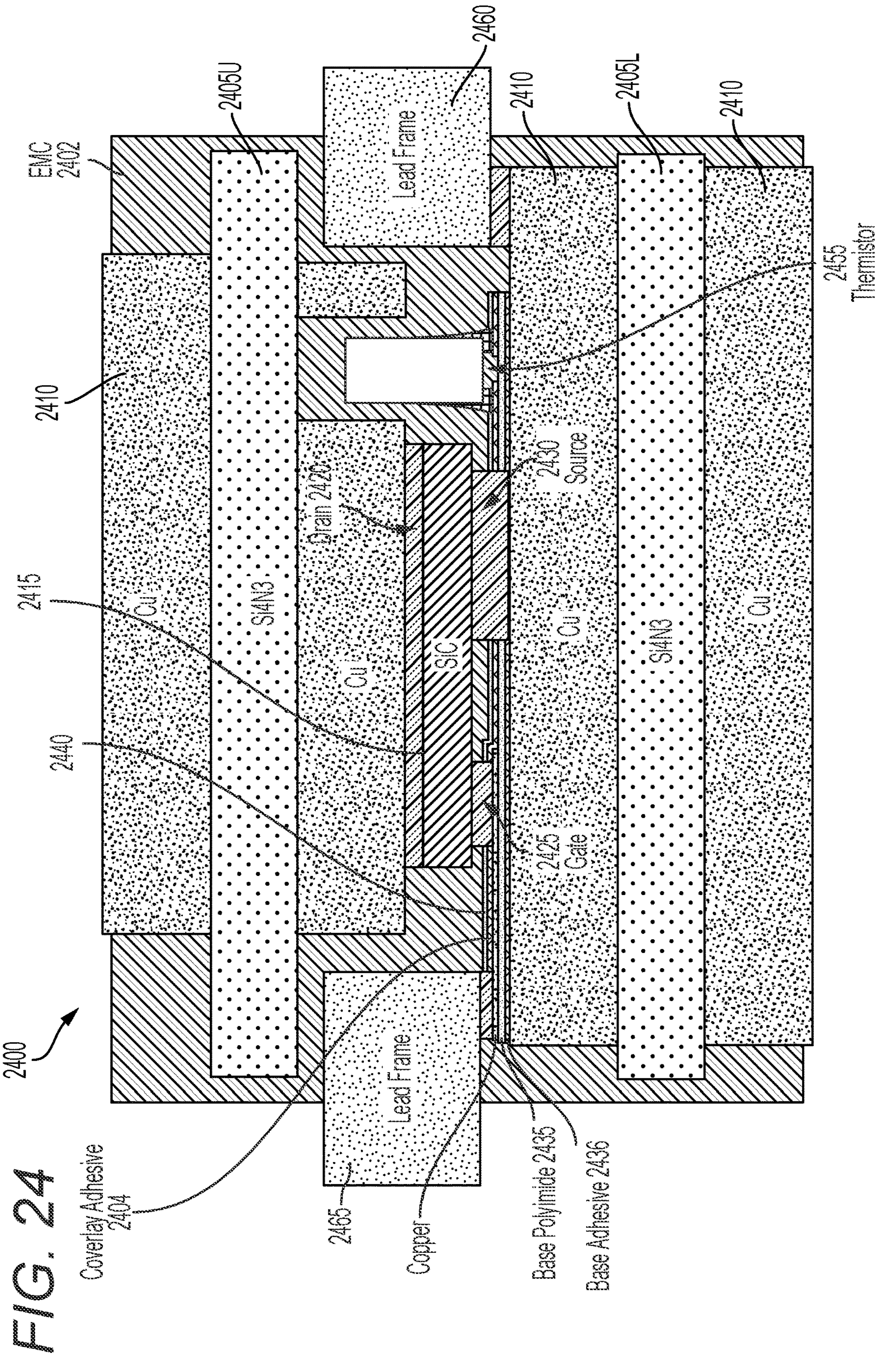
FIG. 24 depicts an exemplary architecture for a power module including a thermistor, according to one or more embodiments.

FIG. 24 depicts an exemplary architecture for a power module 2400 including a thermistor, according to one or more embodiments. As discussed below, power module 2400 may include various layers of metal, substrate, and other components.

Power module 2400 may include upper substrate 2405U and lower substrate 2405L, overlay adhesive 2404, metal layers 2410, lead frame 2460 and 2465, SiC die 2415, drain connection 2420, gate connection 2425, source connection 2430, polyimide or flex circuit 2435, and base adhesive 2436.

The upper substrate 2405U and lower substrate 2405L may be made of ceramic, e.g., silicon nitride ($Si_3N_4$) middle layers having thick metallization, e.g., direct bond copper (DBC) or active metal brazing (AMB) that may be employed on an outer surface and an inner surface of the ceramic middle layer.

Each of the metallization layers 2410 may include multiple conductive regions electrically separated from each other. The power module 2400 may include a semiconductor (e.g., silicon carbide (SiC)) die 2415 that has a drain connection 2420 to the upper substrate 2405U. The source connection 2430 may be attached to the lower substrate 2405L.

A polyimide or flex circuit 2435 including a base polyimide material with an internal copper layer 2440 may be used, thus making interconnect possible to the gate connection 2425 of the SiC MOSFET 2415. Other components of power module 2400 may include lead frame 2460 and 2465 for connection to the positive supply voltage and negative supply voltage. The assembly may be over-molded with a dielectric material 2402. The module may include one or more electrically conductive spacers that provide high current interconnect between an inner surface of upper substrate 2405U and an inner surface of lower substrate 2405L.

An example of a thickness of the metal layers is 400 um+/−0.03 um. An example of a thickness of the substrate layers 2405U/L is 320 um+/−0.05 um. An example of a thickness of the gate is 58 um. An example of a thickness of the source is 100 um+/−25 um. An example of a thickness of the lead frame is 640 um. An example of a thickness of the base polyimide is 12 um. An example of a thickness of the base adhesive is 12 um. But other examples are possible.

Power module 2400 may include overlay adhesive 2404. In an example, the overlay adhesive is 25 μm thick. Power module 2400 may include overlay polyimide above overlay adhesive 2404. In an example, the overlay polyimide is 12 um.

One or more embodiments may provide technical advantages. For example, disclosed systems include switchable inverter circuits that facilitate reconfiguration of inverters to and from different winding configurations, integrated power modules that include such switchable inverters, and integrated packages that include multiple power modules with thermal management. While the examples discussed herein describe electrical inverters for use in driving electric motors and/or in battery charging circuits, the disclosure is not limited thereto. Rather, the disclosed inverters may be used in any circuit.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system comprising:

an inverter to convert DC power from a voltage source to AC power to drive a motor, wherein the inverter includes:

a first power module including:

one or more first phase switches;

one or more second phase switches;

one or more positive DC power tabs on a first side of the first power module, the one or more positive DC power tabs connected to a positive DC rail to provide positive DC power to the one or more first phase switches and the one or more second phase switches;

one or more negative DC power tabs on the first side of the first power module, the one or more negative DC power tabs connected to a negative DC rail to provide negative DC power to the one or more first phase switches and the one or more second phase switches;

one or more first phase AC power tabs on a second side of the first power module opposite to the first side, the one or more first phase AC power tabs to receive AC power from the one or more first phase switches; and one or more second phase AC power tabs on the second side of the first power module, the one or more second phase AC power tabs to receive AC power from the one or more second phase switches.

2. The system of claim 1, wherein the first power module further includes:

a flex circuit including an insulating material and an electrically conductive material.

3. The system of claim 2, wherein the first power module further includes:

a thermistor connected to the flex circuit.

4. The system of claim 1, wherein the first power module further includes:

a changeover switch to change a connection of the one or more first phase switches and the one or more second phase switches with a first winding of the motor.

5. The system of claim 1, wherein the first power module further includes:

a first substrate having an outer surface and an inner surface;

a second substrate having an outer surface and an inner surface; and an electrically conductive spacer coupled to the inner surface of the first substrate and to the inner surface of the second substrate, wherein the one or more first phase switches and the one or more second phase switches are coupled to the inner surface of the first substrate and to the inner surface of the second substrate.

6. The system of claim 1, wherein:

the first power module is configured to drive a first AC phase of the motor, and the inverter further includes:

a second power module to drive a second AC phase of the motor; and a third power module to drive a third AC phase of the motor.

7. The system of claim 1, wherein the inverter further includes:

a capacitor.

8. The system of claim 1, wherein the inverter further includes:

a heat sink.

9. The system of claim 1, further including:

the voltage source to supply the DC power to the inverter; and the motor to receive the AC power from the inverter to drive the motor, wherein the system is provided as a vehicle including the inverter, the voltage source, and the motor.

10. A system comprising a power module for an inverter, the power module including:

one or more first phase switches;

one or more second phase switches;

one or more positive DC power tabs on a first side of the power module, the one or more positive DC power tabs connected to a positive DC rail to provide positive DC power to the one or more first phase switches and the one or more second phase switches;

one or more negative DC power tabs on the first side of the power module, the one or more negative DC power tabs connected to a negative DC rail to provide negative DC power to the one or more first phase switches and the one or more second phase switches;

one or more first phase AC power tabs on a second side of the power module opposite to the first side, the one or more first phase AC power tabs to receive AC power from the one or more first phase switches; and one or more second phase AC power tabs on the second side of the power module, the one or more second phase AC power tabs to receive AC power from the one or more second phase switches.

11. The system of claim 10, wherein the power module further includes:

a flex circuit including an insulating material and an electrically conductive material; and a thermistor connected to the flex circuit.

12. The system of claim 10, wherein the power module further includes:

a changeover switch to change a connection of the one or more first phase switches and the one or more second phase switches with a winding of a motor.

13. The system of claim 10, wherein the power module further includes:

one or more neutral power tabs.

14. The system of claim 10, wherein one or more of the one or more first phase switches or the one or more second phase switches includes silicon carbide.

15. The system of claim 10, wherein the power module further includes:

one or more signal pins.

16. The system of claim 10, wherein the power module further includes:

a first substrate having an outer surface and an inner surface;

a second substrate having an outer surface and an inner surface; and an electrically conductive spacer coupled to the inner surface of the first substrate and to the inner surface of the second substrate, wherein the one or more first phase switches and the one or more second phase switches are coupled to the inner surface of the first substrate and to the inner surface of the second substrate.

17. The system of claim 10, wherein:

the one or more first phase switches include a first upper phase switch and a first lower phase switch, the one or more second phase switches include a second upper phase switch and a second lower phase switch, the one or more positive DC power tabs include a first positive DC power tab for the first upper phase switch and a second positive DC power tab for the second upper phase switch, and the one or more negative DC power tabs include a first negative DC power tab for the first lower phase switch and a second negative DC power tab for the second lower phase switch.

18. A system comprising:

an inverter to convert DC power from a voltage source to AC power to drive a motor, wherein the inverter includes:

a first power module to drive a first AC phase of the motor;

a second power module to drive a second AC phase of the motor; and a third power module to drive a third AC phase of the motor, wherein each of the first power module, the second power module, and the third power module includes:

one or more first phase switches;

one or more second phase switches;

one or more positive DC power tabs on a first side of each of the first power module, the second power module, and the third power module, the one or more positive DC power tabs connected to a positive DC rail to provide positive DC power to the one or more first phase switches and the one or more second phase switches;

one or more negative DC power tabs on the first side of each of the first power module, the second power module, and the third power module, the one or more negative DC power tabs connected to a negative DC rail to provide negative DC power to the one or more first phase switches and the one or more second phase switches;

one or more first phase AC power tabs on a second side of each of the first power module, the second power module, and the third power module, the second side opposite to the first side, the one or more first phase AC power tabs to receive AC power from the one or more first phase switches; and one or more second phase AC power tabs, on the second side of each of the first power module, the second power module, and the third power module, the one or more second phase AC power tabs to receive AC power from the one or more second phase switches.

19. The system of claim 18, wherein each of the first power module, the second power module, and the third power module further includes:

one or more neutral power tabs.

20. The system of claim 18, wherein the inverter further includes:

a heat sink provided on a third side of the first power module, the second power module, and the third power module; and one or more capacitors provided on a fourth side of the first power module, the second power module, and the third power module, the fourth side opposite from the second side.

* * * * *